(12) United States Patent
Yamazaki et al.

(10) Patent No.: US 9,203,044 B2
(45) Date of Patent: Dec. 1, 2015

(54) LIGHT-EMITTING BODY, LIGHT-EMITTING LAYER, AND LIGHT-EMITTING DEVICE

(75) Inventors: Shunpei Yamazaki, Setagaya (JP); Satoshi Seo, Sagamihara (JP); Nobuharu Ohsawa, Zama (JP); Satoko Shitagaki, Isehara (JP); Hideko Inoue, Atsugi (JP); Hiroshi Kadoma, Sagamihara (JP); Harue Osaka, Sagamihara (JP); Kunihiko Suzuki, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/370,672

(22) Filed: Feb. 10, 2012

(65) Prior Publication Data
US 2012/0205687 A1      Aug. 16, 2012

(30) Foreign Application Priority Data

Feb. 16, 2011   (JP) ................................ 2011-031013

(51) Int. Cl.
  *H01L 29/20*   (2006.01)
  *H01L 21/00*   (2006.01)
  *H01L 51/50*   (2006.01)

(52) U.S. Cl.
  CPC .......... *H01L 51/5016* (2013.01); *H01L 51/504* (2013.01); *H01L 2251/5384* (2013.01)

(58) Field of Classification Search
  CPC ... H01L 27/30; H01L 27/3239; H01L 31/143; H01L 31/162; H01L 33/08; H01L 33/18; H01L 33/24; H01L 51/5032; H01L 25/048; H01L 27/288; H01L 27/32
  USPC .......... 257/40, 642, 643, 759, 98; 438/29, 69, 438/82, 99
  See application file for complete search history.

(56) References Cited

U.S. PATENT DOCUMENTS 3,947,707 A  *  3/1976  Shannon et al. .............. 327/514
7,250,226 B2     7/2007  Tokito et al.
(Continued)

FOREIGN PATENT DOCUMENTS

CN   1547597    11/2004
CN   1825658    8/2006
(Continued)

OTHER PUBLICATIONS

International Search Report (Application No. PCT/JP2012/053441) Dated Mar. 13, 2012.
(Continued)

*Primary Examiner* — Julio J Maldonado
*Assistant Examiner* — Moin Rahman
(74) *Attorney, Agent, or Firm* — Eric J. Robinson; Robinson Intellectual Property Law Office, P.C.

(57) ABSTRACT

An organic light-emitting element having high efficiency and long lifetime is provided. An organic light-emitting body is provided which includes a host having a high electron-transport property (n-type host), a host having a high hole-transport property (p-type host), and a guest such as an iridium complex and in which the n-type host and the p-type host are located so as to be adjacent to each other. When an electron and a hole are injected to such a light-emitting body, the electron is trapped by the n-type host and the hole is trapped by the p-type host. Then, both the electron and the hole are injected to the guest, and thus the guest is brought into an excited state. In this process, less thermal deactivation occurs and the working rate of the guest is high; thus, highly efficient light emission can be obtained.

15 Claims, 22 Drawing Sheets

(56) References Cited

U.S. PATENT DOCUMENTS

| | | |
|---|---|---|
| 7,572,522 B2 | 8/2009 | Seo et al. |
| 7,601,439 B2 | 10/2009 | Chun et al. |
| 7,943,925 B2 | 5/2011 | Yamazaki |
| 8,048,536 B2 | 11/2011 | Isobe |
| 2003/0015960 A1* | 1/2003 | Seo et al. .................. 313/504 |
| 2003/0091862 A1 | 5/2003 | Tokito et al. |
| 2003/0143427 A1* | 7/2003 | Matsuo et al. ............ 428/690 |
| 2004/0183082 A1* | 9/2004 | Yamazaki .................... 257/79 |
| 2005/0145830 A1 | 7/2005 | Sakakibara et al. |
| 2006/0115679 A1 | 6/2006 | Chun et al. |
| 2006/0130893 A1* | 6/2006 | Gregg ........................ 136/263 |
| 2006/0131562 A1* | 6/2006 | Li ................................ 257/40 |
| 2006/0134464 A1 | 6/2006 | Nariyuki |
| 2007/0116981 A1 | 5/2007 | Isobe |
| 2007/0145885 A1* | 6/2007 | Tadokoro et al. ......... 313/504 |
| 2008/0197769 A1* | 8/2008 | Seo et al. .................. 313/504 |
| 2009/0174308 A1* | 7/2009 | Yamazaki et al. ........ 313/498 |
| 2010/0089443 A1* | 4/2010 | Bloomstein et al. ...... 136/255 |
| 2011/0001146 A1 | 1/2011 | Yamazaki et al. |

FOREIGN PATENT DOCUMENTS

| | | |
|---|---|---|
| CN | 1965052 | 5/2007 |
| EP | 1424350 A | 6/2004 |
| EP | 1516901 A | 3/2005 |
| EP | 1661899 A | 5/2006 |
| EP | 1715019 A | 10/2006 |
| EP | 2154165 A | 2/2010 |
| EP | 2159237 A | 3/2010 |
| JP | 2003-342325 A | 12/2003 |
| JP | 2004-027088 A | 1/2004 |
| JP | 2005-015508 A | 1/2005 |
| JP | 2005-158520 A | 6/2005 |
| JP | 2006-156941 A | 6/2006 |
| JP | 2007-042875 A | 2/2007 |
| JP | 2007-214465 A | 8/2007 |
| JP | 4553142 | 9/2010 |
| KR | 2006-0133541 A | 12/2006 |
| KR | 10-0708655 B | 4/2007 |
| WO | WO 00/70655 | 11/2000 |
| WO | WO-03/018653 | 3/2003 |
| WO | WO-2004/003105 | 1/2004 |
| WO | WO-2005/061657 | 7/2005 |

OTHER PUBLICATIONS

Written Opinion (Application No. PCT/JP2012/053441) Dated Mar. 13, 2012.

Baldo et al. "Very high-efficiency green organic light-emitting devices based on electrophosphorescence", Applied Physics Letters, vol. 75, No. 1, pp. 4-6, Jul. 5, 1999.

Choong et al. "Organic light-emitting diodes with a bipolar transport layer," Applied Physics Letters, vol. 75, No. 2, pp. 172-174, Jul. 12, 1999.

Itano et al. "Exciplex formation at the organic solid-state interface: Yellow emission in organic light-emitting diodes using green-fluorescent tris(8-quinolinolato)aluminum and hole-transporting molecular materials with low ionization potentials," Applied Physics Letters, vol. 72, No. 6, pp. 636-638, Feb. 9, 1998.

\* cited by examiner

LIGHT-EMITTING BODY, LIGHT-EMITTING LAYER, AND LIGHT-EMITTING DEVICE

TECHNICAL FIELD

The present invention relates to carrier-injection organic electroluminescence (EL).

BACKGROUND ART

Organic EL has recently been attracting attention for application to light-emitting devices and display devices (see Non-patent Document 1 and Non-patent Document 2). Products to which an organic EL light-emitting phenomenon is applied are being put to practical use (for example, see Patent Document 1). There are generally two excited states a light-emitting material can be in, which are a singlet excited state and a triplet excited state, and the former is considered to be probabilistically about one-third of the latter.

The ground state of a light-emitting material is a singlet state, and for ordinary organic molecules, the transition from the singlet excited state to the ground state is possible, but the transition from the triplet excited state to the ground state is forbidden. In other words, although light emission can be obtained through the transition from the singlet excited state to the ground state, in many cases, the direct transition from the triplet excited state to the ground state does not occur, and the transition from the triplet excited state to the ground state is made via various levels. In that process, energy is released not as light but as heat. Such a phenomenon is called thermal deactivation.

As described above, the probability of transition into the singlet excited state is one-third of that of transition into the triplet excited state. Therefore, much of energy given to the light-emitting material is lost as heat via the triplet excited state, which results in poor efficiency. In addition, a large amount of heat is generated, which causes deterioration of an organic material.

In order to solve such problems, a technique has been developed for increasing emission efficiency by adding an organic material containing a heavy metal (particularly, iridium) to a light-emitting material at about 5% (see Non-patent Document 1). In such a technique, a main constituent is called a host, and an organic material added is called guest (or dopant).

In this technique, a host molecule in the triplet excited state returns to the ground state by transferring the state to a guest molecule, and conversely the guest molecule receives the excited state from the host molecule and is brought into the triplet excited state. The guest molecule can return to the ground state from the triplet excited state through light emission owing to spin-orbit interaction.

REFERENCES

[Patent Document 1] United States Patent Application Publication No. 2011/0001146

[Non-patent Document 1] M. A. Baldo, S. Lamansky, P. E. Burrows, M. E. Thompson, S. R. Forrest, "Very high-efficiency green organic light-emitting devices based on electrophosphorescence", Appl. Phys. Lett., pp. 4-6, vol. 75, 1999.

[Non-patent Document 2] Vi-En Choong, Song Shi, Jay Curless, Chan-Long Shieh, H.-C. Lee, and Franky So, "Organic light-emitting diodes with a bipolar transport layer", Appl. Phys. Lett., pp. 172-174, vol. 75, 1999.

DISCLOSURE OF INVENTION

However, a substance serving as a host normally has a high transporting property for either electrons or holes but has a poor transporting property for the other. Therefore, in a light-emitting layer, light emission is expected to occur in a region closer to an electrode from which carriers that are less transported by the host are injected. Thus, it is considered that emission efficiency is lower than it should be and deterioration is more significant than expected.

For example, in the case where a host is a material having an excellent electron-transport property, the hole-transport property of the host is relatively poor. Thus, in a light-emitting layer (EML) including such a host, recombination of holes and electrons and light emission resulting therefrom occur mainly on the anode side as illustrated in FIG. 2A. On the other hand, it is expected that light emission hardly occurs on the cathode side with respect to the middle of the light-emitting layer.

In other words, this light-emitting layer is kept in a state where there are a relatively large number of electrons in a region from the cathode to the region where light emission occurs, as illustrated in FIG. 2B. The number of electrons is small in the vicinity of the anode, because electrons are consumed through light emission. On the other hand, holes are localized in the vicinity of the anode. As a result, light emission occurs in the vicinity of the anode. If light emission occurs only in a localized portion as mentioned above, only the portion easily deteriorates.

In addition, the light-emitting layer is evenly doped with guest molecules. If light emission occurs in a localized portion as mentioned above, guest molecules in a portion where light emission does not occur are not used at all, whereas the guest molecules in the portion where light emission occurs constantly repeatedly undergo excitation and light emission, which may lead to a situation where the portion where light emission occurs is deficient in guest molecules. Accordingly, many host molecules return to the ground state through thermal deactivation without being able to transfer the state to guest molecules. The existence of such host molecules causes a decrease in emission efficiency.

Because high-concentration doping with a guest causes a decrease in emission efficiency, the concentration of a guest is set to about 5% or less of the host, in which case a considerable number of host molecules and guest molecules have other host molecules sandwiched therebetween. In the case where host molecules are in an excited state, the state is more likely to be transferred to guest molecules if the guest molecules are next to the excited host molecules. On the contrary, if the guest molecules are away from the host molecules, it is difficult to transfer the state to the guest molecules and is likely to cause thermal deactivation.

The thickness of the light-emitting layer is small, at most 100 nm, and it is thus technically difficult to confirm the above-described facts. Therefore, it can be said that even the problems are not known yet. On the other hand, the present inventors recognized such problems and considered that if the problems could be solved, it was possible to achieve light emission with higher efficiency than before and provide a display device with less deterioration than before. In other words, it is an object of the present invention to provide a theory which fundamentally solves such problems as described above and to provide novel EL light-emitting devices based on that theory.

The present inventors propose a theory that guest molecules in a relatively wide region emit light. As described above, one host has a significantly poor transporting property for one carrier and has an excellent transporting property for only the other, and therefore, a light-emitting region is limited. The light-emitting region can be expanded by widely distributing carriers, and in order to achieve this, it is necessary to improve the electron-transport property and the hole-transport property of the light-emitting layer in a balanced manner.

As a method for achieving that, it is preferable that host molecules of a light-emitting layer include both molecules of a material having a high electron-transport property (referred to as n-type host) or the like and molecules of a material having a high hole-transport property (referred to as p-type host) or the like. For example, a material obtained by mixing the n-type host with the p-type host is used as a host. As a result, light emission occurs throughout the light-emitting layer.

However, when carriers can easily move as mentioned above, electrons that reach an anode and holes that reach a cathode without contributing to light emission also increase. Thus, light emission of the light-emitting layer needs to be performed efficiently. Efficient light emission of the light-emitting layer makes it possible to decrease electrons that reach the anode and holes that reach the cathode without contributing to light emission.

In order to perform efficient light emission, a number of regions each including at least one molecule of an n-type host (referred to as n-type host clusters) and a number of regions each including at least one molecule of a p-type host (p-type host clusters) are preferably dispersed in the light-emitting layer. For example, at least 10 n-type host clusters and p-type host clusters may alternately exist in the thickness direction (the direction of carrier movement) of the light-emitting layer.

It is also preferable to prevent an n-type host cluster and a p-type host cluster from being next to each other and provide at least one guest molecule (or region including at least one guest molecule (guest cluster)) between the n-type host cluster and the p-type host cluster.

In other words, one embodiment of the present invention is an organic light-emitting body which includes a guest cluster including at least one guest molecule, an n-type host cluster including at least one n-type host molecule, and a p-type host cluster including at least one p-type host molecule, in which the guest cluster is sandwiched between the n-type host cluster and the p-type host cluster. Here, the n-type host is a material having a high electron-transport property and the p-type host is a material having a high hole-transport property. Such materials may be selected from host materials disclosed in Patent Document 1.

Another embodiment of the present invention is a light-emitting layer which includes the above-described organic light-emitting body. Another embodiment of the present invention is a light-emitting element which includes the above-described light-emitting layer. The light-emitting element may include two or more above-described light-emitting layers. In the case where the light-emitting element includes two or more above-described light-emitting layers, the light-emitting layers may emit light with different wavelengths.

The above-described light-emitting element may further include any of a hole-injection layer, a hole-transport layer, an electron-transport layer, an electron-injection layer, an electron-relay layer, an intermediate layer, and the like. As materials of the light-emitting layer, the hole-injection layer, the hole-transport layer, the electron-transport layer, the electron-injection layer, the electron-relay layer, the intermediate layer, and the like, materials disclosed in Patent Document 1, for example, may be used as appropriate.

Another embodiment of the present invention is a passive-matrix display device, an active-matrix display device, or a lighting device which includes the above-described light-emitting layer. For details of the passive-matrix display device, the active-matrix display device, or the lighting device, Patent Document 1 can be referred to.

FIGS. 1 A to 1F are some conceptual diagrams of the present invention. FIG. 1A illustrates the most basic structure, in which an n-type host cluster (denoted by N-HC in the diagram) and a p-type host cluster (P-HC) are attracted to a guest molecule (G) by intermolecular forces. In other words, FIG. 1A illustrates the case where there is some interaction between the guest molecule and the n-type host cluster and between the guest molecule and the p-type host cluster. The interaction may be van der Waals forces, hydrogen bonds, or the like.

In FIGS. 1A to 1F, the degree of overlap between a guest molecule and an n-type or p-type host cluster relatively indicates the degree of interaction therebetween. There may be a case where the interaction is strong to such an extent that orbitals of molecules overlap and the molecules can be regarded as one molecule. In addition, even when, for example, an n-type host cluster is illustrated as being distant from a p-type host cluster or a guest molecule, there is some interaction therebetween.

For example, there may be considerable interaction between a guest molecule and a p-type host cluster, whereas the interaction between the guest molecule and an n-type host cluster may be weaker than that. Such a case can be illustrated as in FIG. 1B.

Note that even in such a case, there is no significant obstacle to implementation of the present invention unless there is another molecule between the guest molecule and the n-type host cluster. Similarly, even in the case where the interactions between a guest molecule and an n-type host cluster and between the guest molecule and a p-type host cluster are significantly weak, the present invention can be implemented as along as the guest molecule is next to the host clusters. It is needless to say that strong interaction is favorable to the transfer of an electronic state which is described later.

The n-type host cluster, the guest molecule, and the p-type host cluster do not necessarily need to be arranged linearly. For example, as illustrated in FIG. 1C, the n-type host cluster may be at a right angle or another angle with respect to the direction of the bond between the guest molecule and the p-type host cluster.

In one embodiment of the present invention, n-type host clusters and p-type host clusters are adjacent to each other with guest molecules sandwiched therebetween. In other words, as illustrated in FIG. 1D, n-type host clusters and p-type host clusters are linearly arranged with guest molecules sandwiched therebetween. In order to obtain such a structure, the n-type host clusters and the p-type host clusters are preferably formed using materials which repel each other.

Furthermore, such linear rows of n-type and p-type host clusters can be arranged in a plane as illustrated in FIG. 1E or FIG. 1F. Although the lateral interaction is illustrated as being stronger than the longitudinal interaction (i.e., the host clusters and the guest molecules overlap each other in the lateral direction but not in the longitudinal direction) in FIG. 1E and FIG. 1F, the longitudinal interaction may be equal to or stronger than the lateral interaction.

Note that because the n-type host and the p-type host have different electron-transport properties (electron mobilities)

and hole-transport properties (hole mobilities), the mixing ratio may be determined depending on these properties. Furthermore, in the above description, the n-type host clusters may include a plurality of kinds of n-type hosts, and similarly, the p-type host clusters may include a plurality of kinds of p-type hosts. Although FIGS. 1A to 1F illustrate some embodiments of the present invention, it is needless to say that the present invention is not limited thereto.

N-type hosts tend to become negative ions (anions) by gaining electrons, and p-type hosts tend to become positive ions (cations). In the case where an n-type host and a p-type host next to a guest molecule become an anion and a cation, respectively, an electron and a hole are transferred to the guest by an interaction such as a coulomb force and the guest is brought into an excited state. After that, the guest returns to the ground state by emitting light.

Such a phenomenon occurs throughout a light-emitting layer; therefore, guest molecules in any portion are used evenly, which can solve the problem of excess or deficient guest molecules and can minimize thermal deactivation.

It should be noted that the above-described light-emitting mechanism is greatly different from a conventional light-emitting mechanism with a host and a guest. The conventional light-emitting mechanism involves a stage where one host molecule is excited and transfers the state to one guest molecule. On the other hand, in the above-described excitation light-emitting mechanism, electrons and holes are injected from at least two host molecules into at least one guest molecule, whereby the guest molecule is excited.

In the case where an n-type host molecule and a p-type host molecule adjacently exist and are an anion (i.e., a state where electrons exist at the lowest unoccupied molecular orbital (LUMO)) and a cation (i.e., a state where holes exist at the highest occupied, molecular orbital (HOMO)), respectively, there is a low probability that either of the n-type host molecule or the p-type host molecule is excited (i.e., brought into a state where holes exist at the HOMO and electrons exist at the LUMO) and the other is brought into the ground state, and there is a dominant probability that the n-type host molecule and the p-type host molecule remain an anion and a cation, respectively.

If there is one guest molecule between the n-type host and the p-type host, electrical charges of the n-type host which is an anion and the p-type host which is a cation are transferred to the guest molecule, whereby the guest molecule is brought into an excited state. Note that there is a high probability that an electron and a hole are injected to the guest molecule substantially at the same time, and the guest molecule is an anion or a cation for a sufficiently short time.

This is because if the guest molecule becomes an anion, the guest molecule attracts a hole by a coulomb force. It is needless to say that the length of time in which the guest molecule is in an ionic state depends on the properties of the guest or the properties of the n-type host or the p-type host such as electron-transport properties or hole-transport properties.

In the case where the guest molecule is already in an excited state, the host molecule cannot transfer the excited state to the guest molecule during a period from excitation to light emission. Therefore, in a conventional mechanism in which the excited state of one host molecule is transferred to one guest molecule, if a guest molecule is already in an excited state, even when the next host molecule is in an excited state, the host molecule cannot transfer the state to the guest molecule, and there is a high probability that the host molecule is thermally deactivated before transferring the state.

On the other hand, in the above-described process, an n-type host molecule and a p-type host molecule are rarely brought into an excited state and normally become an anion and a cation. An n-type host molecule which has become an anion and a p-type host molecule which has become a cation are stable and can excite a guest after remaining in that state for a considerably long time. Even if these host molecules become neutral molecules from ions, energy loss is limited. Accordingly, the guest can be excited efficiently.

For example, the case where, between a first n-type host molecule and a guest molecule, there is a second n-type host molecule will be considered. If the first n-type host molecule becomes an anion, the first n-type host molecule cannot transfer the state directly to the guest molecule because the second n-type host molecule exists therebetween. However, by transferring an electron to the second n-type host molecule, the first n-type host molecule can change the second n-type host molecule into an anion and can itself become a neutral molecule. In addition, energy loss is limited in this process. The second n-type host molecule which has become an anion can rapidly transfer an electron to the next guest molecule.

Note that the electron-transport property and hole-transport property of an n-type host differ from the electron-transport property and hole-transport property of a p-type host. For example, in the case where the electron mobility of an n-type host is lower than the hole mobility of a p-type host, the proportion of the n-type host may be increased so as to widely distribute electrons in a light-emitting layer. As a result, light emission occurs throughout the light-emitting layer.

BEST MODE FOR CARRYING OUT THE INVENTION

Embodiments will be hereinafter described with reference to drawings. Note that embodiments can be carried out in many different modes, and it is easily understood by those skilled in the art that modes and details of the present invention can be modified in various ways without departing from the spirit and the scope of the present invention. Therefore, the present invention should not be interpreted as being limited to the description in the following embodiments.
Embodiment 1)

Figure 1A:
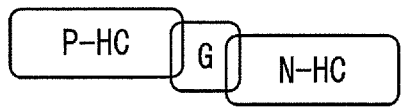
FIGS. 1A to 1F illustrate a variety of embodiments of the present invention.
Figure 1B:
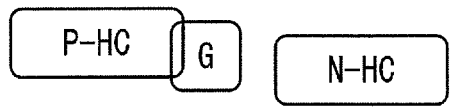
Figure 1C:
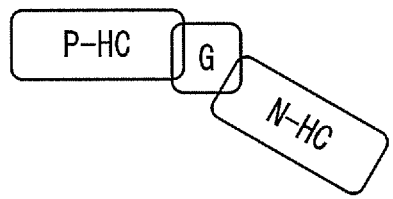
Figure 1D:
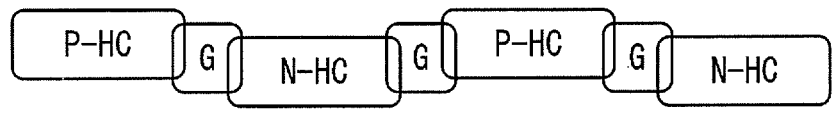
Figure 1E:
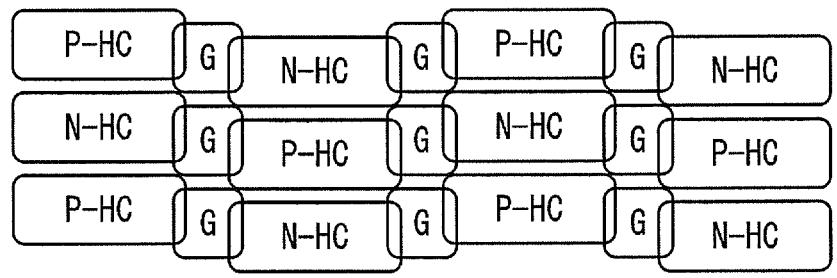
Figure 1F:
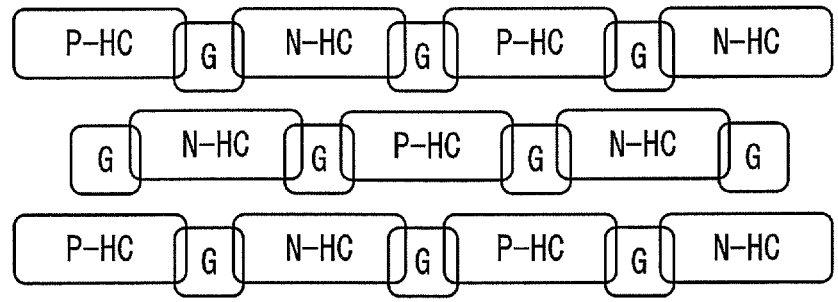
Figure 2A:
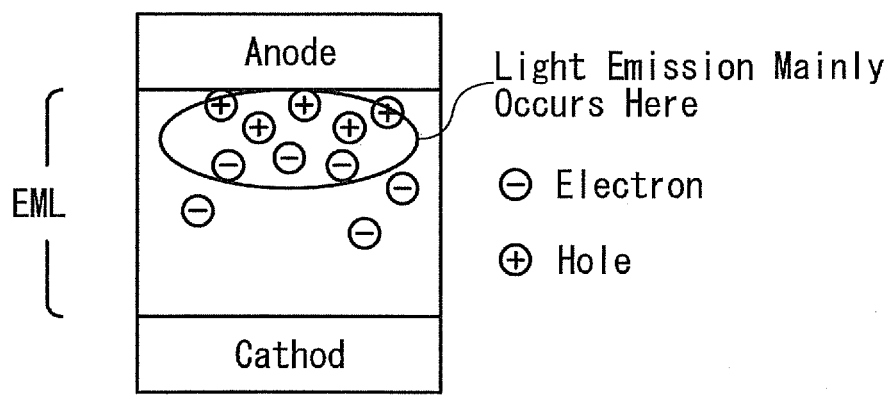
FIGS. 2A and 2B illustrate a conventional light-emitting mechanism.
Figure 2B:
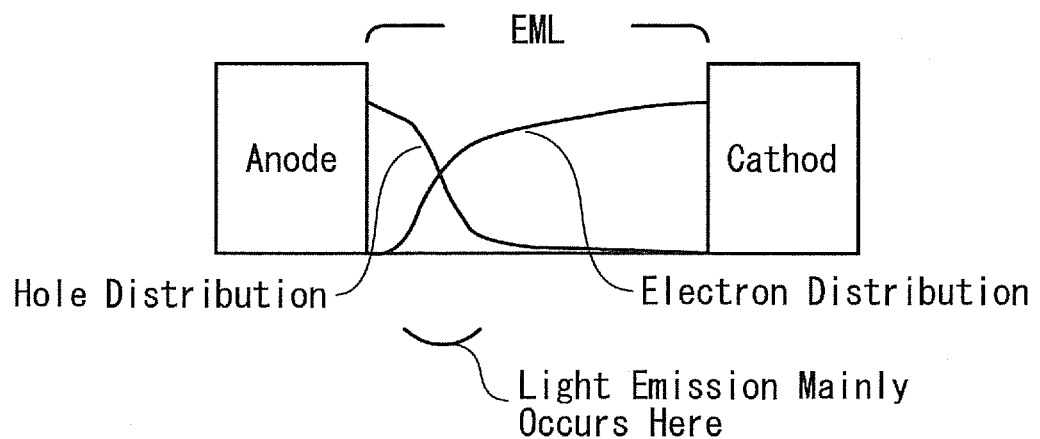
Figure 3A:
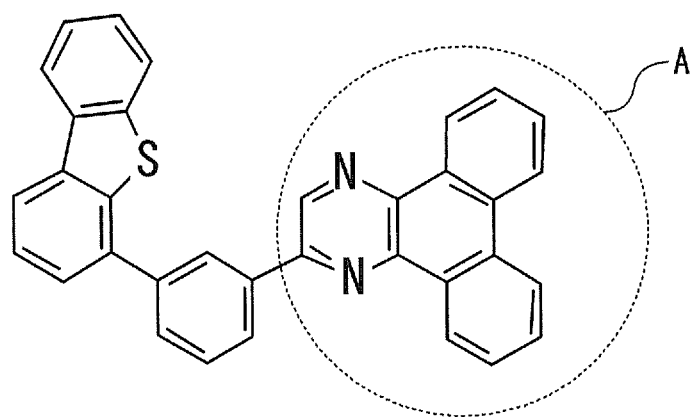
FIGS. 3A to 3C illustrate Embodiment 1.

In this embodiment, examples of materials which can be used as an n-type host, a p-type host, and a guest will be described. FIG. 3A shows a molecular structural formula of 2-[3-(dibenzothiophen-4-yl)phenyl]dibenzo[f,h]quinoxaline (abbreviation: 2mDBTPDBq-II) which can be used as the n-type host. In general, when a heteroatom (i.e., an atom having higher electronegativity than carbon), such as a nitrogen atom, is introduced to constituent atoms of a six-membered aromatic ring such as a benzene ring, the heteroatom attracts π electrons on the ring and the aromatic ring tends to be deficient in electrons. In the diagram, a portion A surrounded by a dotted line corresponds to a portion which is deficient in π electrons, and this portion is likely to trap electrons. Heteroaromatic compounds comprising six-membered rings generally tend to serve as n-type hosts.

Figure 3B:
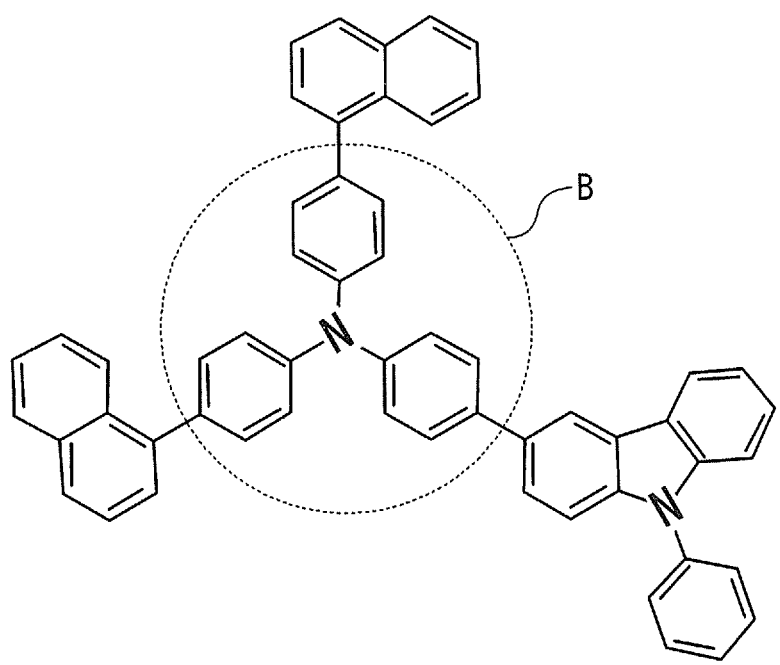

FIG. 3B shows a molecular structural formula of 4,4'-di(1-naphthyl)-4''-(9-phenyl-9H-carbazol-3-yl)triphenylamine (abbreviation: PCBNBB) which can be used as a p-type host. In general, when a nitrogen atom, located outside an aromatic ring such as a benzene ring, is bound to the ring, the nitrogen atom donates an unshared electron pair to the benzene ring, whereby electrons become excess and tend to be released (i.e., holes are likely to be trapped). In the diagram, a portion B surrounded by a dotted line corresponds to a portion which is in excess of it electrons, and this portion is likely to release electrons (or trap holes).

In addition, 4'-bis[N-(1-naphthyl)-N-phenylamino]biphenyl (abbreviation: NPB) can be used as a p-type host. Aromatic amine compounds generally tend to serve as p-type hosts. However, non-amine compounds such as 9-phenyl-9H-3-(9-phenyl-9H-carbazol-3-yl)carbazole (abbreviation: PCCP) also serve as p-type hosts.

Figure 3C:
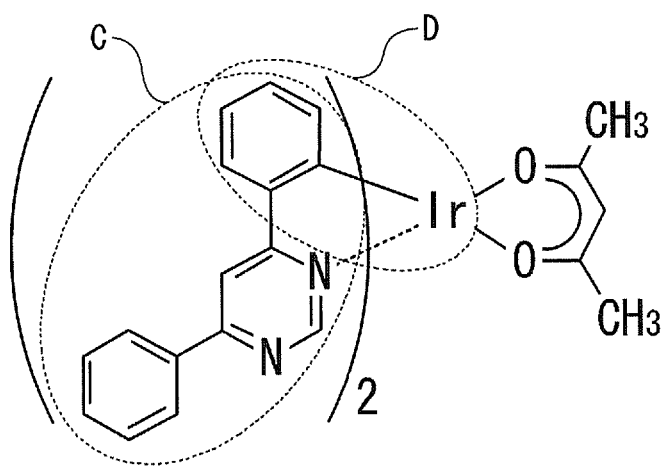

FIG. 3C shows a molecular structural formula of (acetylacetonato)bis(4,6-diphenylpyrimidinato)iridium(III) (abbreviation: [Ir(dppm)$_2$(acac)]) which can be used as a guest. In general, iridium complexes form an excited state called metal-to-ligand charge transfer (MLCT) excited state. This is a state in which an electron on an orbital of a metal atom is excited to an orbital of a ligand, which means that the HOMO exists around the metal atom and the LUMO exits around the ligand.

In addition, as a guest, bis(3,5-dimethyl-2-phenylpyrazinato)(dipivaloylmethanato)iridium(III) (abbreviation: [Ir(mppr-Me)$_2$(dpm)]), bis(2,3,5-triphenylpyrazinato)(dipivaloylmethanato)iridium(III) (abbreviation: [Ir(tppr)$_2$(dpm)]), or the like can be used.

As illustrated in FIG. 3C, electrons are trapped by a ligand in a portion C surrounded by a dotted line, and holes are trapped by a portion D surrounded by a dotted line which corresponds to a region from a metal atom (here, Ir) to the ligand.

In order to perform efficient light emission using such an n-type host, a p-type host, and a guest as described above, it is preferable that the portion A surrounded by a dotted line in the n-type host molecule illustrated in FIG. 3A is adjacent to the portion C surrounded by a dotted line in the guest molecule illustrated in FIG. 3C, and that the portion B surrounded by a dotted line in the p-type host molecule illustrated in FIG. 3B is adjacent to the portion D surrounded by a dotted line in the guest molecule illustrated in FIG. 3C.

In general, it is more preferable that a heteroaromatic ring of an n-type host molecule (in FIG. 4, a quinoxaline skeleton) is adjacent to an end of a ligand of a guest molecule (in FIG. 4, a phenylpyrimidine site), and that an aromatic amine of a p-type host molecule is adjacent to metal atom-benzene skeleton of the guest molecule. This structure in which an n-type host molecule and a p-type host molecule are adjacent to each other with a guest molecule sandwiched therebetween is novel. In this specification, this structure is referred to as "guest coupled with complementary hosts" (GCCH). An example thereof is illustrated in FIG. 4.

Figure 4:
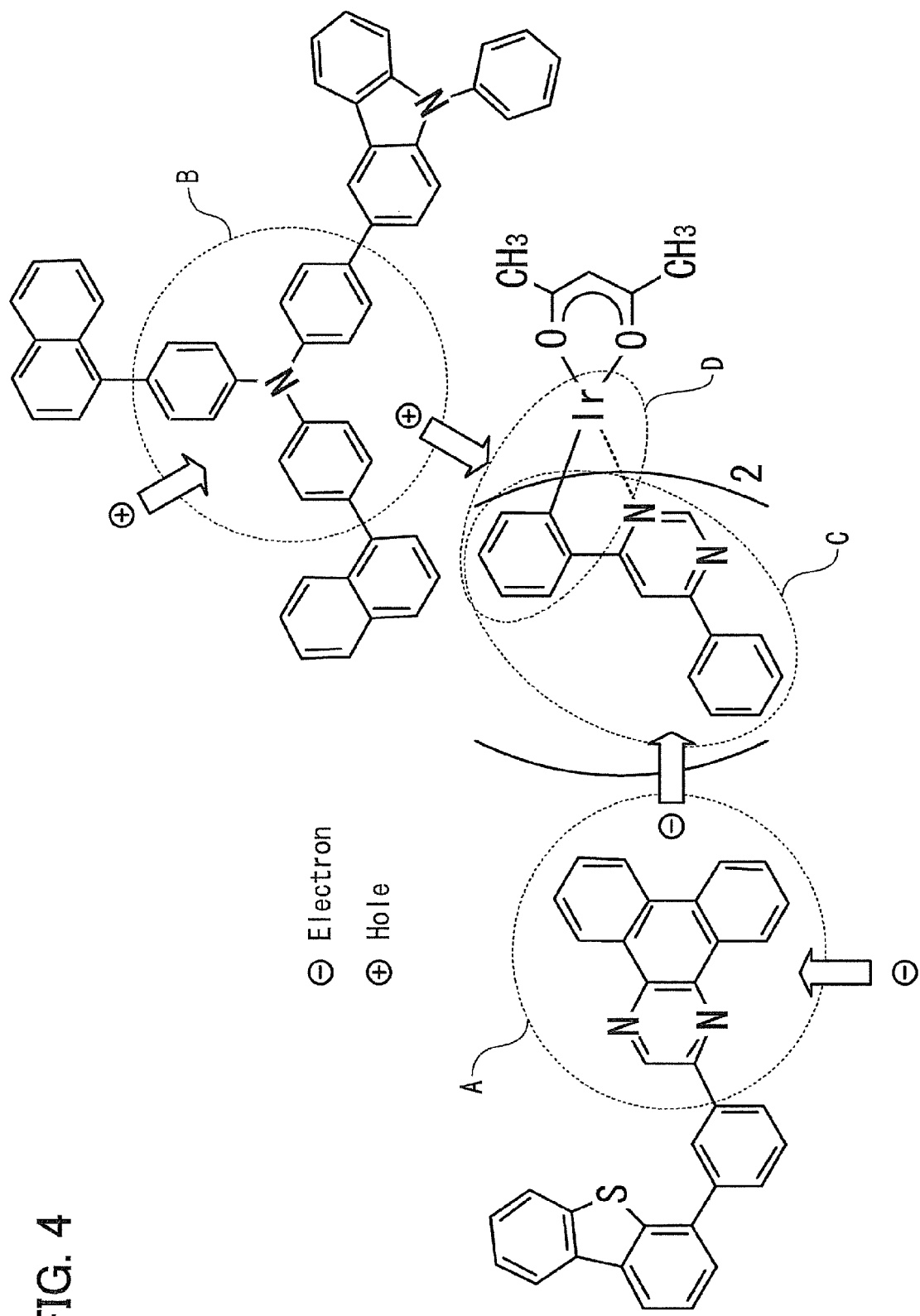
FIG. 4 illustrates Embodiment 1.

In the case where an electron and a hole are injected to a light-emitting body having the structure illustrated in FIG. 4, the electron is trapped by a dotted line portion A of an n-type host molecule and then rapidly transferred to a dotted line portion C of a guest molecule adjacent to the dotted line portion A. The hole is trapped by a dotted line portion B of a p-type host molecule and then rapidly transferred to a dotted line portion D of the guest molecule adjacent to the dotted line portion B. As a result, the guest molecule is brought into an excited state and emits light when returning to the ground state.

Energy loss due to thermal deactivation is extremely small during a period in which a carrier is transferred to the guest molecule from the n-type host molecule or the p-type host molecule and the guest molecule is brought into an excited state; thus, highly efficient light emission can be obtained. Furthermore, such excitation and light emission similarly occur at substantially all light-emitting bodies in the light-emitting layer; therefore, a load on each light-emitting body is small so that the light-emitting bodies have a long lifetime.

EXAMPLE 1

In this example, a light-emitting element of one embodiment of the present invention will be described. Chemical formulae of materials used in this example are shown below.

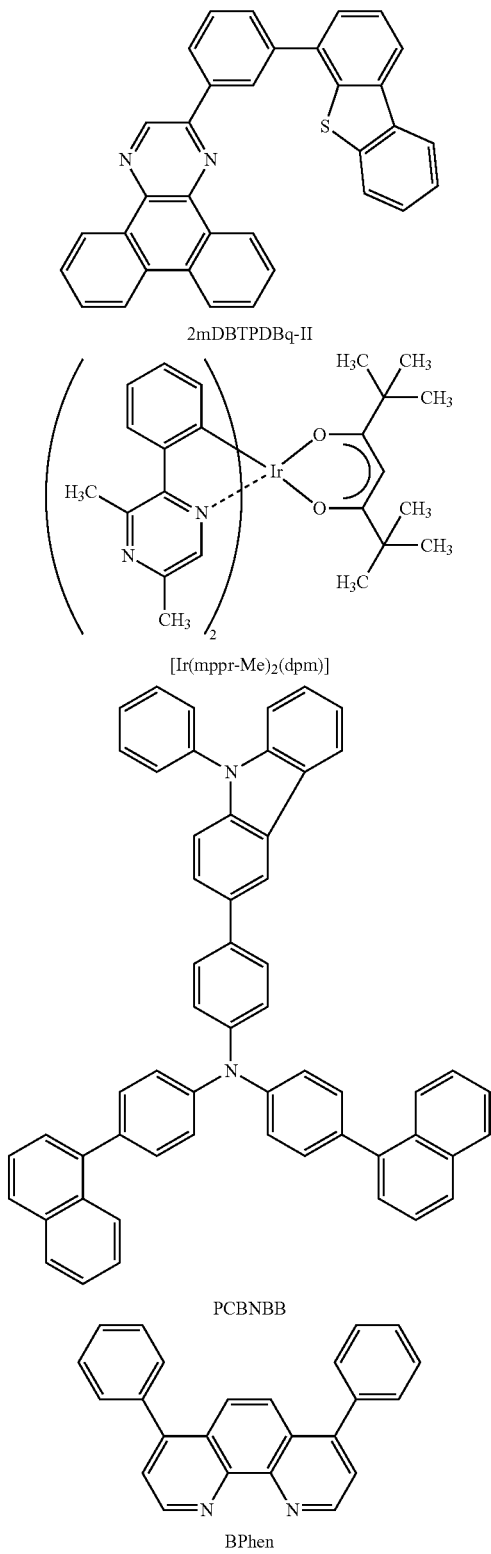

2mDBTPDBq-II

[Ir(mppr-Me)₂(dpm)]

PCBNBB

BPhen

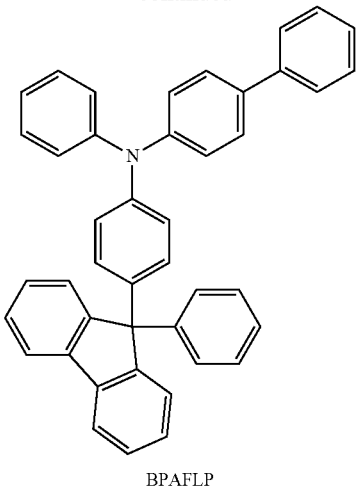 [SMILES: c1ccc(-c2ccc(N(c3ccccc3)c3ccc(C4(c5ccccc5)c5ccccc5-c5ccccc54)cc3)cc2)cc1]

BPAFLP

Methods for manufacturing a light-emitting element 1 and a comparative light-emitting element 2 of this example will be described below.

(Light-Emitting Element 1)

First, a film of indium tin oxide containing silicon (ITSO) was formed over a glass substrate by a sputtering method, so that a first electrode functioning as an anode was formed. Note that the thickness was set to 110 nm and the electrode area was set to 2 mm×2 mm.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Next, the substrate provided with the first electrode was fixed to a substrate holder in the vacuum evaporation apparatus so that a surface on which the first electrode was provided faced downward. The pressure in the vacuum evaporation apparatus was reduced to about $10^{-4}$ Pa. Then, 4-phenyl-4'-(9-phenylfluoren-9-yl)triphenylamine (abbreviation: BPAFLP) and molybdenum(VI) oxide were co-evaporated to form a hole-injection layer over the first electrode. The thickness of the hole-injection layer was set to 40 nm, and the weight ratio of BPAFLP to molybdenum oxide was adjusted to 4:2 (=BPAFLP:molybdenum oxide).

Next, over the hole-injection layer, a film of BPAFLP was formed to a thickness of 20 nm to form a hole-transport layer.

Furthermore, 2mDBTPDBq-II, PCBNBB, and [Ir(mppr-Me)₂(dpm)] were co-evaporated to form a light-emitting layer over the hole-transport layer. Here, the weight ratio of 2mDBTPDBq-II to PCBNBB and [Ir(mppr-Me)₂(dpm)] was adjusted to 0.8:0.2:0.05 (=2mDBTPDBq-II:PCBNBB:[Ir(mppr-Me)₂(dpm)]). The thickness of the light-emitting layer was set to 40 nm.

Further, over the light-emitting layer, a film of 2mDBTPDBq-II was formed to a thickness of 10 nm to form a first electron-transport layer.

Next, over the first electron-transport layer, a film of bathophenanthroline (abbreviation: BPhen) was formed to a thickness of 20 nm to form a second electron-transport layer.

Further, over the second electron-transport layer, a film of lithium fluoride (LiF) was formed by evaporation to a thickness of 1 nm to form an electron-injection layer.

Lastly, an aluminum film was formed by evaporation to a thickness of 200 nm as a second electrode functioning as a cathode. Thus, the light-emitting element 1 of this example was fabricated.

(Comparative Light-Emitting Element 2)

A light-emitting layer of the comparative light-emitting element 2 was formed by co-evaporating 2mDBTPDBq-II and [Ir(mppr-Me)$_2$(dpm)]. Here, the weight ratio of 2mDBTPDBq-II to [Ir(mppr-Me)$_2$(dpm)] was adjusted to 1:0.05 (=2mDBTPDBq-II:[Ir(mppr-Me)$_2$(dpm)]). The thickness of the light-emitting layer was set to 40 nm. Components other than the light-emitting layer were manufactured in a manner similar to that of the light-emitting element 1.

Note that, in all the above evaporation steps, evaporation was performed by a resistance-heating method.

Table 1 shows element structures of the light-emitting element 1 and the comparative light-emitting element 2 obtained as described above. In this example, 2mDBTPDBq-II is an n-type host, PCBNBB is a p-type host, and [Ir(mppr-Me)$_2$(dpm)] is a guest. In other words, in the light-emitting element 1, both the n-type host and the p-type host are included in the light-emitting layer, whereas in the comparative light-emitting element 2, the p-type host does not exist in the light-emitting layer.

TABLE 1

| | light-emitting element 1 | comparative light-emitting element 2 |
|---|---|---|
| first electrode | ITSO, 110 nm | ITSO, 110 nm |
| hole-injection layer | BPAFLP:MoOx (=4:2), 40 nm | BPAFLP:MoOx (=4:2), 40 nm |
| hole-transport layer | BPAFLP, 20 nm | BPAFLP, 20 nm |
| light-emitting layer | 2mDBTPDBq-II: PCBNBB: [Ir(mppr-Me)$_2$(dpm)] (=0.8:0.2:0.05), 40 nm | 2mDBTPDBq-II: [Ir(mppr-Me)$_2$(dpm)] (=1:0.05), 40 nm |
| first electron-transport layer | 2mDBTPDBq-II, 10 nm | 2mDBTPDBq-II, 10 nm |
| second electron-transport layer | Bphen, 20 nm | Bphen, 20 nm |
| electron-injection layer | LiF, 1 nm | LiF, 1 nm |
| second electrode | Al, 200 nm | Al, 200 nm |

In a glove box containing a nitrogen atmosphere, these light-emitting elements were sealed so as not to be exposed to air. Then, operation characteristics of these light-emitting elements were measured. Note that the measurements were carried out at room temperature (in the atmosphere kept at 25° C.).

Figure 5:
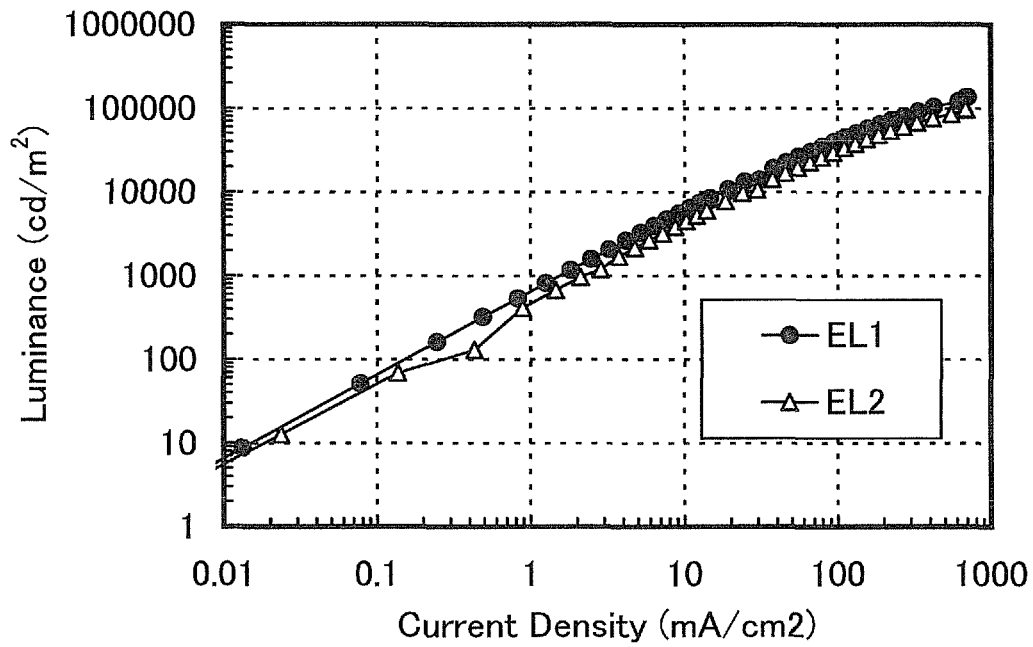
FIG. 5 shows current density-luminance characteristics of light-emitting elements of Example 1.
Figure 6:
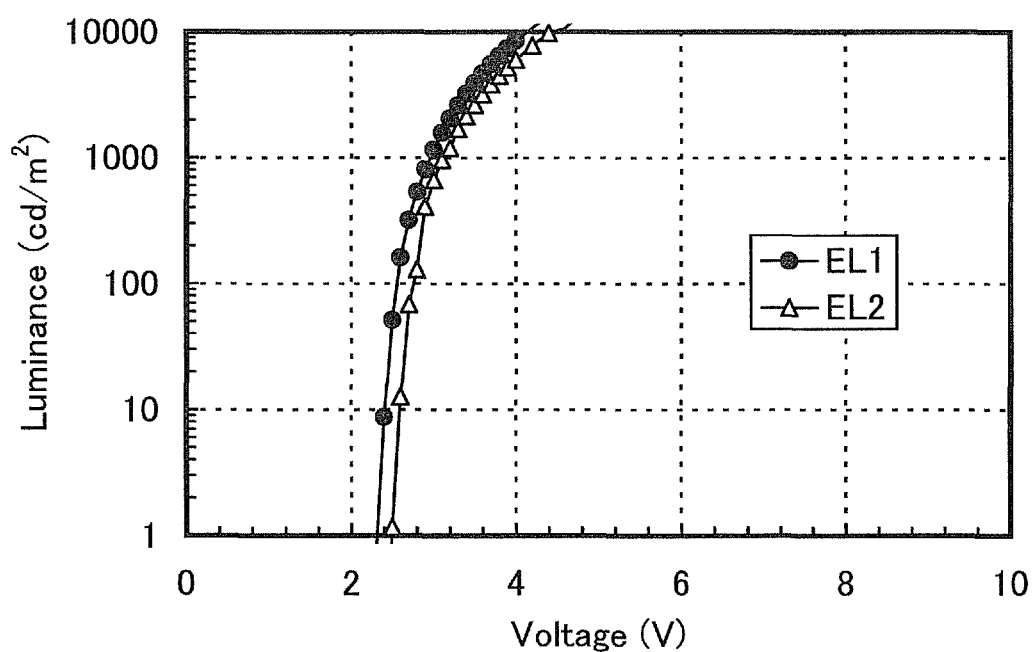
FIG. 6 shows voltage-luminance characteristics of the light-emitting elements of Example 1.
Figure 7:
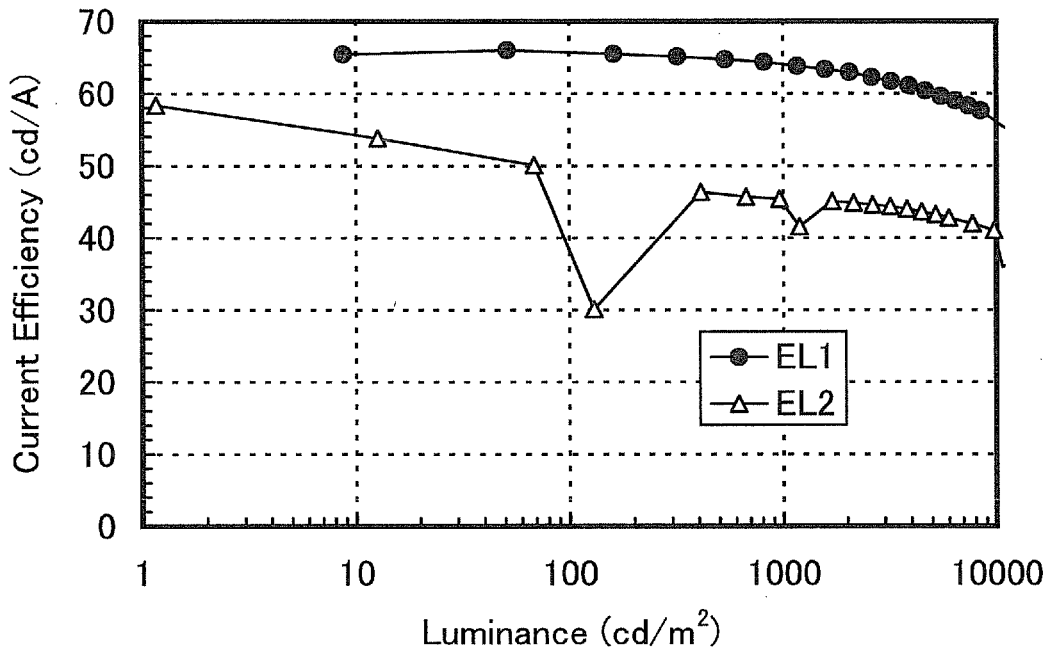
FIG. 7 shows luminance-current efficiency characteristics of the light-emitting elements of Example 1.
Figure 8:
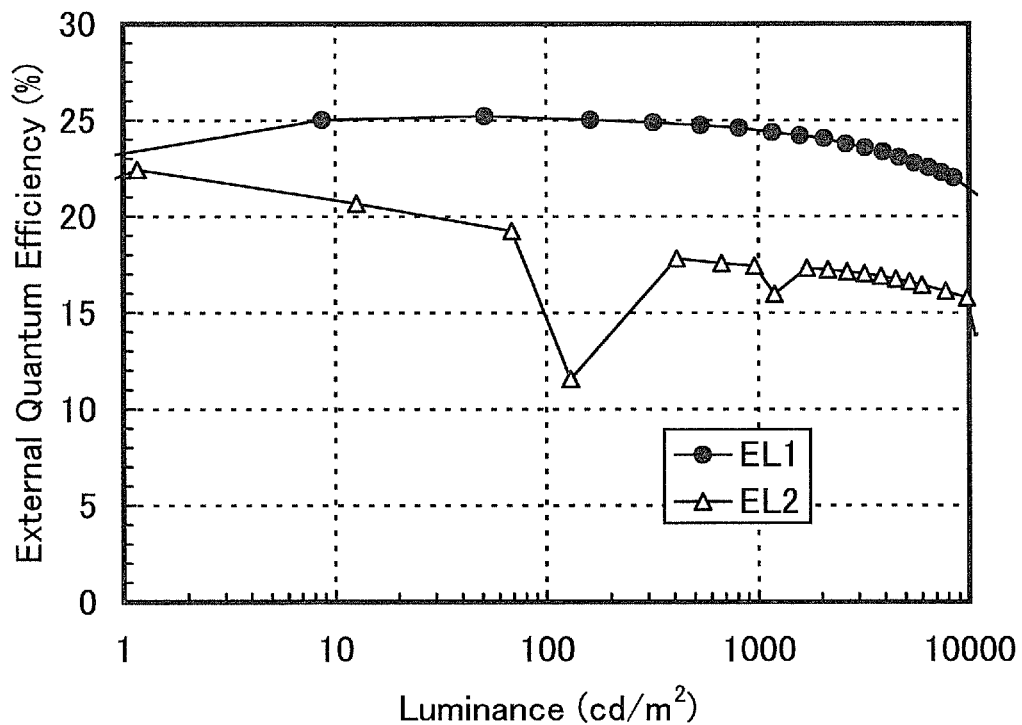
FIG. 8 shows luminance-external quantum efficiency characteristics of the light-emitting elements of Example 1.

FIG. 5 shows current density-luminance characteristics of the light-emitting element 1 (EL1) and the comparative light-emitting element 2 (EL2). In FIG. 5, the horizontal axis represents current density (mA/cm$^2$), and the vertical axis represents luminance (cd/m$^2$). FIG. 6 shows voltage-luminance characteristics thereof. In FIG. 6, the horizontal axis represents voltage (V), and the vertical axis represents luminance (cd/m$^2$). FIG. 7 shows luminance-current efficiency characteristics thereof. In FIG. 7, the horizontal axis represents luminance (cd/m$^2$), and the vertical axis represents current efficiency (cd/A). FIG. 8 shows luminance-external quantum efficiency characteristics thereof. In FIG. 8, the horizontal axis represents luminance (cd/m$^2$), and the vertical axis represents external quantum efficiency (%).

Further, Table 2 shows the voltage (V), current density (mA/cm$^2$), CIE chromaticity coordinates (x, y), current efficiency (cd/A), power efficiency (lm/W), and external quantum efficiency (%) of each of the light-emitting element 1 and the comparative light-emitting element 2 at a luminance of around 1000 cd/m$^2$.

TABLE 2

| | voltage (V) | current density (mA/cm$^2$) | chromaticity coordinates (x, y) | luminance (cd/m$^2$) | current efficiency (cd/A) | power efficiency (lm/W) | external quantum efficiency (%) |
|---|---|---|---|---|---|---|---|
| light-emitting element 1 | 3.0 | 1.8 | (0.56, 0.44) | 1200 | 64 | 67 | 24 |
| comparative light-emitting element 2 | 3.1 | 2.1 | (0.55, 0.44) | 960 | 45 | 46 | 17 |

Figure 9:
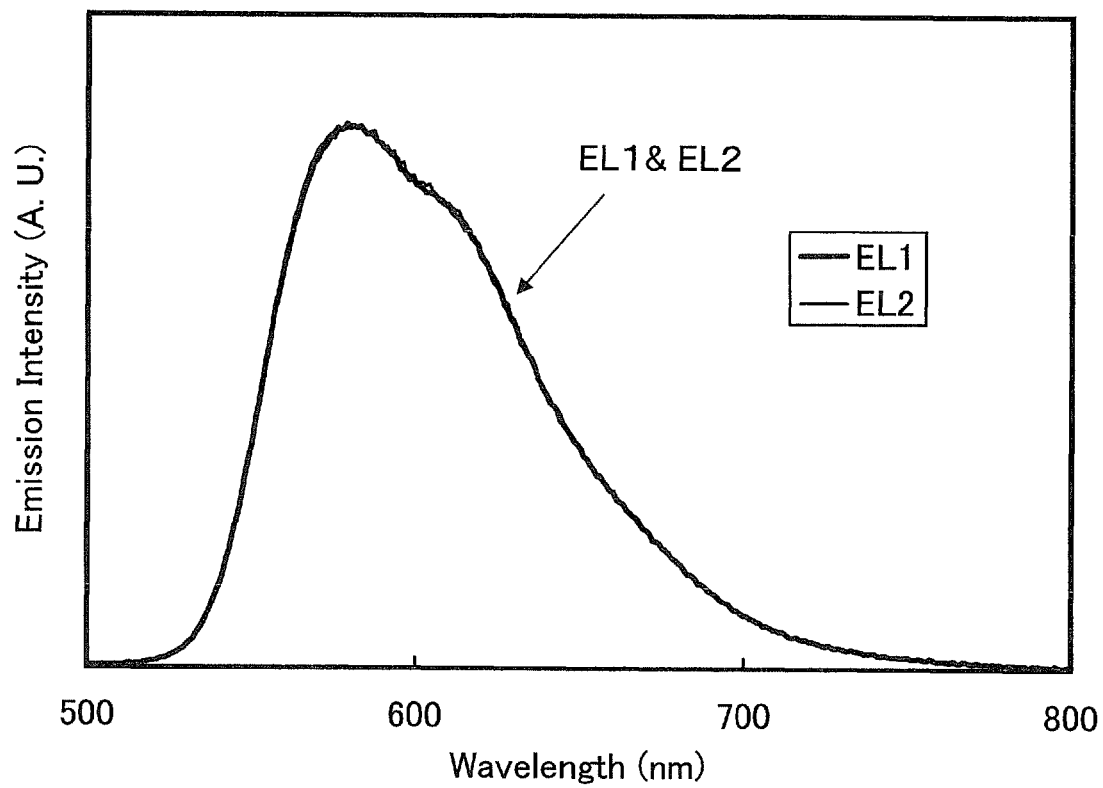
FIG. 9 shows an emission spectrum of the light-emitting elements of Example 1.

FIG. 9 shows emission spectra of the light-emitting element 1 (EL1) and the comparative light-emitting element 2 (EL2) which were obtained by applying a current of 0.1 mA. In FIG. 9, the horizontal axis represents wavelength (nm), and the vertical axis represents emission intensity (arbitrary unit). As shown in Table 2, the CIE chromaticity coordinates of the light-emitting element 1 at a luminance of 1200 cd/m$^2$ were (x, y)=(0.56, 0.44), and the CIE chromaticity coordinates of the comparative light-emitting element 2 at a luminance of 960 cd/m$^2$ were (x, y)=(0.55, 0.44). These results show that orange light emission originating from [Ir(mppr-Me)$_2$(dpm)] was obtained from the light-emitting element 1 and the comparative light-emitting element 2.

As can be seen from Table 2 and FIGS. 5 to 8, the light-emitting element 1 has higher current efficiency, higher power efficiency, and higher external quantum efficiency than the comparative light-emitting element 2. In general, in extraction of light from a light-emitting body to the outside, total reflection occurs between a substrate or the like and the air, and light can be extracted to the outside with only 25% to 30% of the internal quantum efficiency. In view of this, the comparative light-emitting element 2 is estimated to have an internal quantum efficiency of less than 60% at the most, whereas the light-emitting element 1 is estimated to have an internal quantum efficiency of 80% or more. The above results show that an element having high external quantum efficiency can be obtained by application of one embodiment of the present invention.

Figure 10:
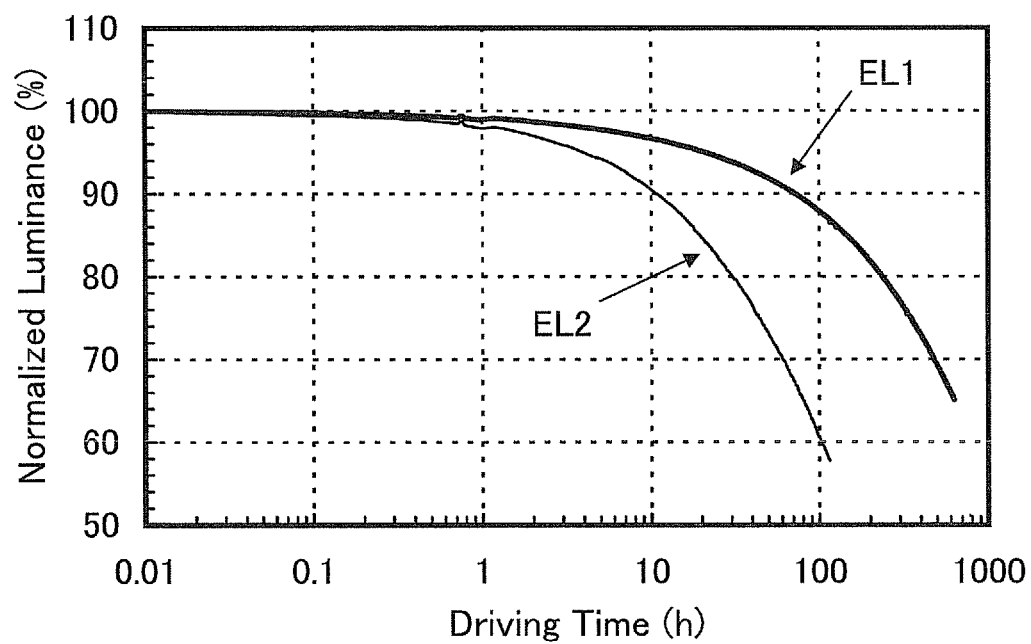
FIG. 10 shows results of reliability tests of the light-emitting elements of Example 1.

Next, the light-emitting element 1 and the comparative light-emitting element 2 were subjected to reliability tests. Results of the reliability tests are shown in FIG. 10. In FIG. 10, the vertical axis represents normalized luminance (%)

with an initial luminance of 100%, and the horizontal axis represents driving time (h) of the elements. In the reliability tests, the light-emitting element 1 and the comparative light-emitting element 2 were driven under the conditions where the initial luminance was set to 5000 cd/m² and the current density was constant.

The luminance of the comparative light-emitting element 2 (EL2) after 120 hours was 58% of the initial luminance. The luminance of the light-emitting element 1 (EL1) after 630 hours was 65% of the initial luminance. From the results, the light-emitting element 1 is found to have a longer lifetime than the comparative light-emitting element 2. The above results show that an element having high reliability can be obtained by application of one embodiment of the present invention.

EXAMPLE 2

In this example, a light-emitting element of one embodiment of the present invention will be described. A chemical formula of a material used in this example is shown below. Note that the chemical formulae of the materials used in the above example are omitted here.

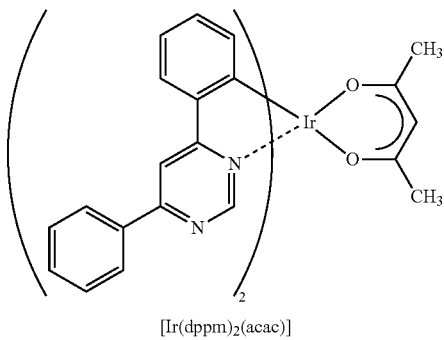

[Ir(dppm)$_2$(acac)]

A method for manufacturing a light-emitting element 3 of this example will be described below.
(Light-Emitting Element 3)

First, a film of ITSO was formed over a glass substrate by a sputtering method, so that a first electrode functioning as an anode was formed. Note that the thickness was set to 110 nm and the electrode area was set to 2 mm×2 mm.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30. minutes.

Next, the substrate provided with the first electrode was fixed to a substrate holder in the vacuum evaporation apparatus so that a surface on which the first electrode was provided faced downward. The pressure in the vacuum evaporation apparatus was reduced to about $10^{-4}$ Pa. Then, BPAFLP and molybdenum(VI) oxide were co-evaporated to form a hole-injection layer over the first electrode. The thickness of the hole-injection layer was set to 40 nm, and the weight ratio of BPAFLP to molybdenum oxide was adjusted to 4:2 (=BPAFLP:molybdenum oxide).

Next, over the hole-injection layer, a film of BPAFLP was formed to a thickness of 20 nm to form a hole-transport layer.

Furthermore, 2mDBTPDBq-II, PCBNBB, and [Ir(dppm)$_2$(acac)] were co-evaporated to form a light-emitting layer over the hole-transport layer. Here, the weight ratio of 2mDBTPDBq-II to PCBNBB and [Ir(dppm)$_2$(acac)] was adjusted to 0.8:0.2:0.05 (=2mDBTPDBq-II:PCBNBB:[Ir(dppm)$_2$(acac)]). The thickness of the light-emitting layer was set to 40 nm.

Further, over the light-emitting layer, a film of 2mDBTPDBq-II was formed to a thickness of 10 nm to form a first electron-transport layer.

Next, over the first electron-transport layer, a film of BPhen was formed to a thickness of 20 nm to form a second electron-transport layer.

Further, over the second electron-transport layer, a film of LiF was formed by evaporation to a thickness of 1 nm to form an electron-injection layer.

Lastly, an aluminum film was formed by evaporation to a thickness of 200 nm as a second electrode functioning as a cathode. Thus, the light-emitting element 3 of this example was fabricated.

Note that, in all the above evaporation steps, evaporation was performed by a resistance-heating method.

Table 3 shows an element structure of the light-emitting element 3 obtained as described above.

TABLE 3

|  | light-emitting element 3 |
| --- | --- |
| first electrode | ITSO, 110 nm |
| hole-injection layer | BPAFLP:MoOx (=4:2), 40 nm |
| hole-transport layer | BPAFLP, 20 nm |
| light-emitting layer | 2mDBTPDBq-II: PCBNBB: [Ir(dppm)$_2$(acac)] (=0.8:0.2:0.05), 40 nm |
| first electron-transport layer | 2mDBTPDBq-II, 10 nm |
| second electron-transport layer | Bphen, 20 nm |
| electron-injection layer | LiF, 1 nm |
| second electrode | Al, 200 nm |

In a glove box containing a nitrogen atmosphere, the light-emitting element 3 was sealed so as not to be exposed to air. Then, operation characteristics of the light-emitting element were measured. Note that the measurements were carried out at room temperature (in the atmosphere kept at 25° C.).

Figure 11:
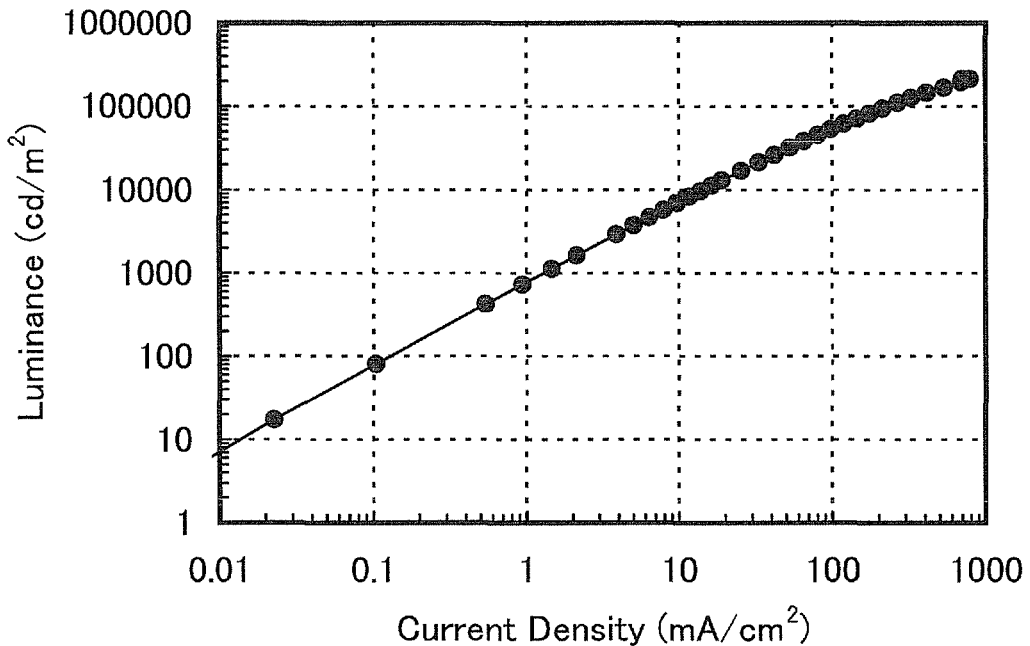
FIG. 11 shows current density-luminance characteristics of a light-emitting element of Example 2.
Figure 12:
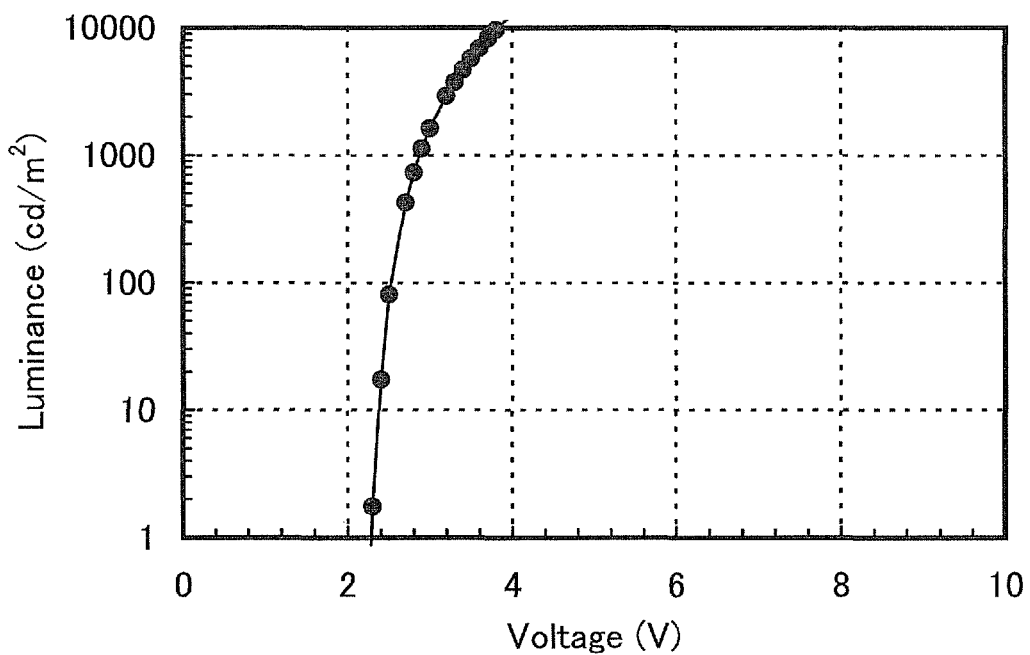
FIG. 12 shows voltage-luminance characteristics of the light-emitting element of Example 2.
Figure 13:
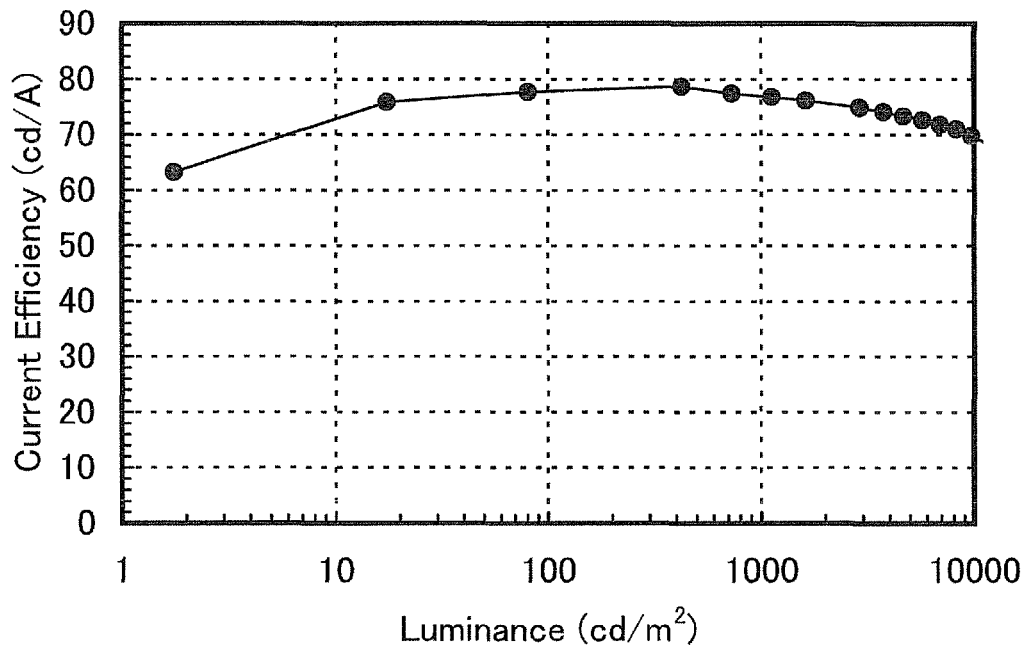
FIG. 13 shows luminance-current efficiency characteristics of the light-emitting element of Example 2.
Figure 14:
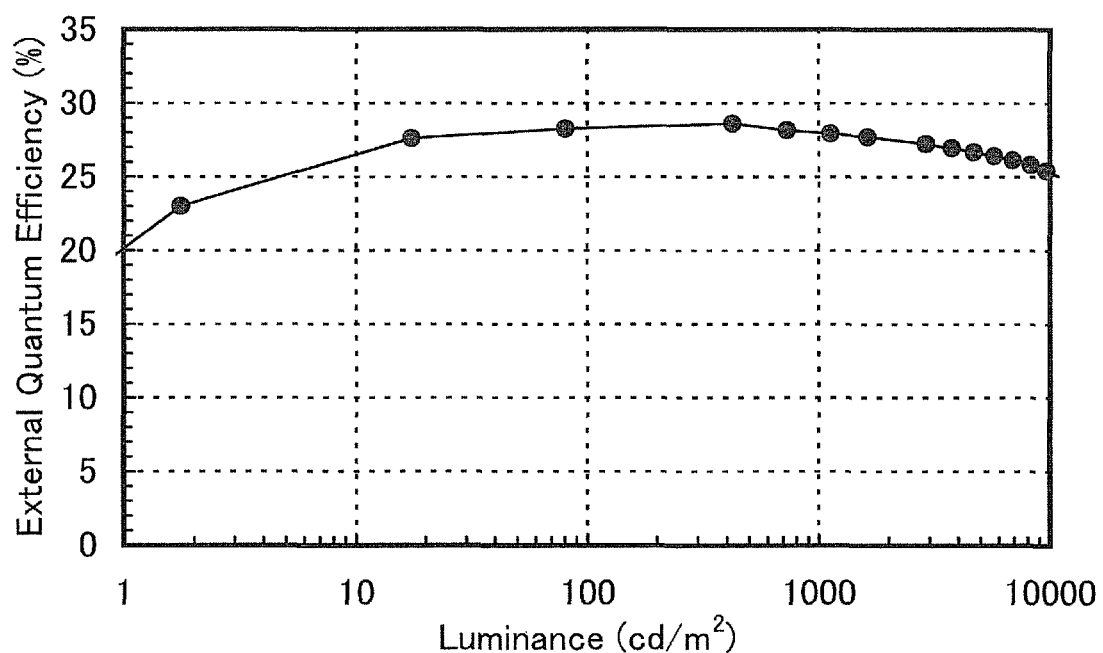
FIG. 14 shows luminance-external quantum efficiency characteristics of the light-emitting element of Example 2.

FIG. 11 shows current density-luminance characteristics of the light-emitting element 3. In FIG. 11, the horizontal axis represents current density (mA/cm²), and the vertical axis represents luminance (cd/m²). FIG. 12 shows voltage-luminance characteristics thereof. In FIG. 12, the horizontal axis represents voltage (V), and the vertical axis represents luminance (cd/m²). FIG. 13 shows luminance-current efficiency characteristics thereof. In FIG. 13, the horizontal axis represents luminance (cd/m²), and the vertical axis represents current efficiency (cd/A). FIG. 14 shows luminance-external quantum efficiency characteristics thereof. In FIG. 14, the horizontal axis represents luminance (cd/m²), and the vertical axis represents external quantum efficiency (%).

Further, Table 4 shows the voltage (V), current density (mA/cm²), CIE chromaticity coordinates (x, y), current efficiency (cd/A), power efficiency (lm/W), and external quantum efficiency (%) of the light-emitting element 3 at a luminance of 1100 cd/m².

TABLE 4

| | voltage (V) | current density (mA/cm²) | chromaticity coordinates (x, y) | current efficiency (cd/A) | power efficiency (lm/W) | external quantum efficiency (%) |
|---|---|---|---|---|---|---|
| light-emitting element 3 | 2.9 | 1.5 | (0.54, 0.46) | 77 | 83 | 28 |

Figure 15:
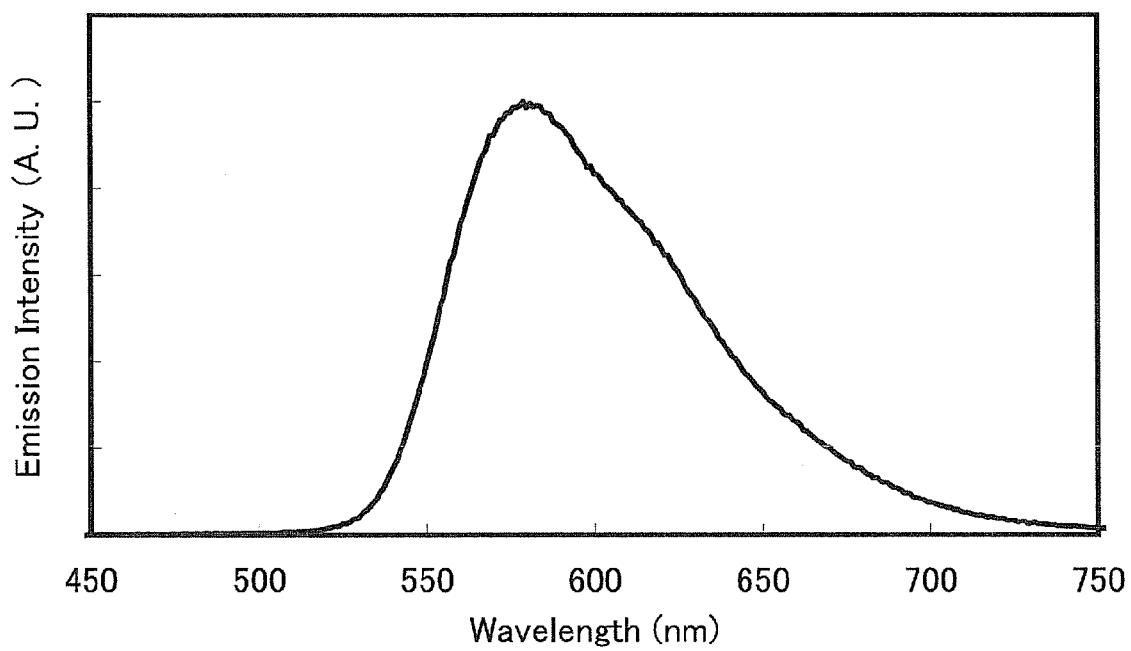
FIG. 15 shows an emission spectrum of the light-emitting element of Example 2.

FIG. 15 shows an emission spectrum of the light-emitting element 3 which was obtained by applying a current of 0.1 mA. In FIG. 15, the horizontal axis represents wavelength (nm), and the vertical axis represents emission intensity (arbitrary unit). As shown in Table 4, the CIE chromaticity coordinates of the light-emitting element 3 at a luminance of 1100 cd/m² were (x, y)=(0.54, 0.46). These results show that orange light emission originating from [Ir(dppm)$_2$(acac)] was obtained from the light-emitting element 3.

As can be seen from Table 4 and FIGS. 11 to 14, the light-emitting element 3 has high current efficiency, high power efficiency, and high external quantum efficiency. In particular, the light-emitting element 3 has an extremely high external quantum efficiency of 28% at a luminance of 1100 cd/m². This is equivalent to an internal quantum efficiency of 90% or more. The above results show that an element having high external quantum efficiency can be obtained by application of one embodiment of the present invention.

Figure 16:
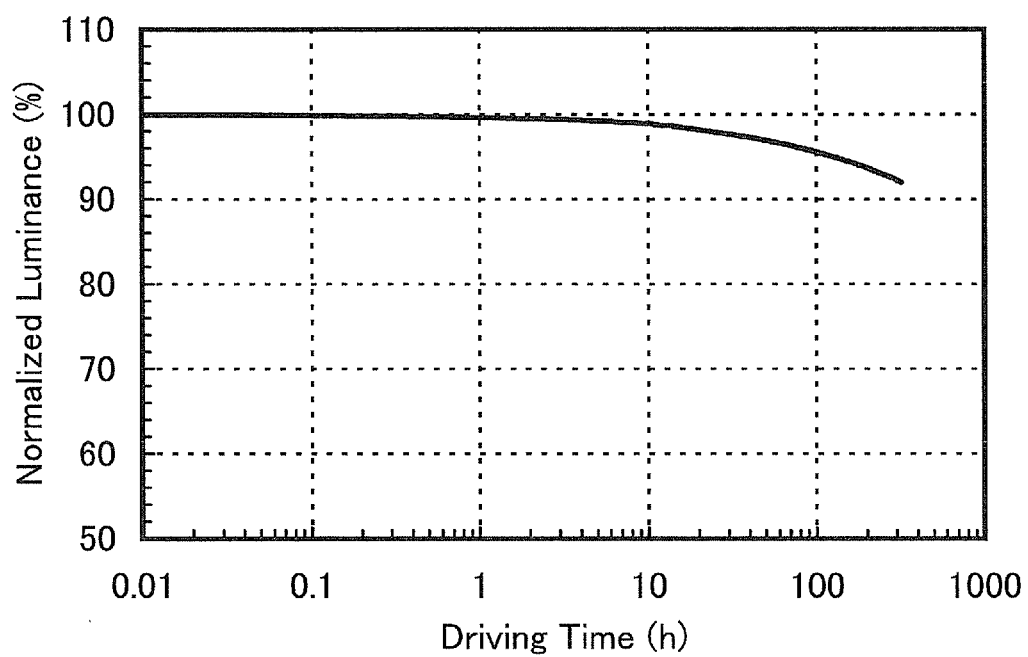
FIG. 16 shows results of reliability tests of the light-emitting element of Example 2.

Next, the light-emitting element 3 was subjected to reliability tests. Results of the reliability tests are shown in FIG. 16. In FIG. 16, the vertical axis represents normalized luminance (%) with an initial luminance of 100%, and the horizontal axis represents driving time (h) of the elements.

In the reliability tests, the light-emitting element 3 was driven under the conditions where the initial luminance was set to 5000 cd/m² and the current density was constant. The light-emitting element 3 kept 92% of the initial luminance after the driving for 320 hours. The above results show that an element having high reliability can be obtained by application of one embodiment of the present invention.

EXAMPLE 3

In this example, a light-emitting element of one embodiment of the present invention will be described. Chemical formulae of materials used in this example are shown below. Note that chemical formulae of the materials used in the above examples are omitted here.

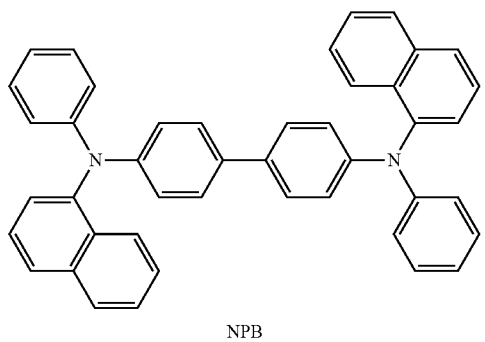

NPB

-continued

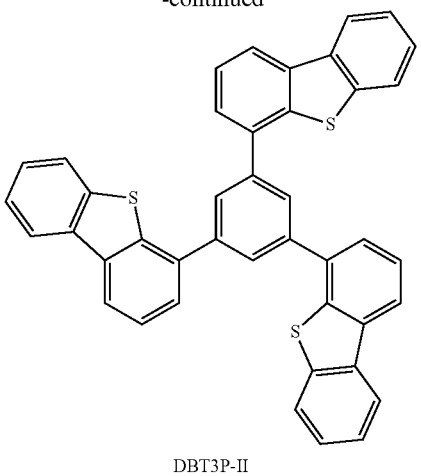

DBT3P-II

Methods for manufacturing a light-emitting element 4 and a comparative light-emitting element 5 of this example will be described below.

(Light-Emitting Element 4)

First, a film of ITSO was formed over a glass substrate by a sputtering method, so that a first electrode functioning as an anode was formed. Note that the thickness was set to 110 nm and the electrode area was set to 2 mm×2 mm.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately 10$^{-4}$ Pa, and was subjected to vacuum baking at 170° C. for 30 minutes in a heating chamber of the vacuum evaporation apparatus, and then the substrate was cooled down for about 30 minutes.

Next, the substrate provided with the first electrode was fixed to a substrate holder in the vacuum evaporation apparatus so that a surface on which the first electrode was provided faced downward. The pressure in the vacuum evaporation apparatus was reduced to about 10$^{-4}$ Pa. Then, 4,4',4"-(1,3,5-benzenetriyl)tri(dibenzothiophene) (abbreviation: DBT3P-II) and molybdenum(VI) oxide were co-evaporated to form a hole-injection layer over the first electrode. The thickness of the hole-injection layer was set to 40 nm, and the weight ratio of DBT3P-II to molybdenum oxide was adjusted to 4:2 (=DBT3P-II:molybdenum oxide).

Next, over the hole-injection layer, a film of BPAFLP was formed to a thickness of 20 nm to form a hole-transport layer.

Furthermore, 2mDBTPDBq-II, NPB, and [Ir(dppm)$_2$(acac)] were co-evaporated to form a light-emitting layer over the hole-transport layer. Here, the weight ratio of 2mDBTP-DBq-II to NPB and [Ir(dppm)$_2$(acac)] was adjusted to 0.8:

0.2:0.05 (=2mDBTPDBq-II:NPB:[Ir(dppm)$_2$(acac)]). The thickness of the light-emitting layer was set to 40 nm.

Further, over the light-emitting layer, a film of 2mDBTP-DBq-II was formed to a thickness of 10 nm to form a first electron-transport layer.

Next, over the first electron-transport layer, a film of BPhen was formed to a thickness of 20 nm to form a second electron-transport layer.

Further, over the second electron-transport layer, a film of LiF was formed by evaporation to a thickness of 1 nm to form an electron-injection layer.

Lastly, an aluminum film was formed by evaporation to a thickness of 200 nm as a second electrode functioning as a cathode. Thus, the light-emitting element 4 of this example was fabricated.

(Comparative Light-Emitting Element 5)

A light-emitting layer of the comparative light-emitting element 5 was formed by co-evaporating 2mDBTPDBq-II and [Ir(dppm)$_2$(acac)]. Here, the weight ratio of 2mDBTPDBq-II to [Ir(dppm)$_2$(acac)] was adjusted to 1:0.05 (=2mDBTPDBq-II:[Ir(dppm)$_2$(acac)]). The thickness of the light-emitting layer was set to 40 nm. Components other than the light-emitting layer were manufactured in a manner similar to that of the light-emitting element 4.

Note that, in all the above evaporation steps, evaporation was performed by a resistance-heating method.

Table 5 shows element structures of the light-emitting element 4 and the comparative light-emitting element 5 obtained as described above.

TABLE 5

| | light-emitting element 4 | comparative light-emitting element 5 |
|---|---|---|
| first electrode | ITSO, 110 nm | ITSO, 110 nm |
| hole-injection layer | DBT3P-II:MoOx (=4:2), 40 nm | DBT3P-II:MoOx (=4:2), 40 nm |
| hole-transport layer | BPAFLP, 20 nm | BPAFLP, 20 nm |
| light-emitting layer | 2mDBTPDBq-II: NPB: [Ir(dppm)$_2$(acac)] (=0.8:0.2:0.05), 40 nm | 2mDBTPDBq-II: [Ir(dppm)$_2$(acac)] (=1:0.05), 40 nm |
| first electron-transport layer | 2mDBTPDBq-II, 10 nm | 2mDBTPDBq-II, 10 nm |
| second electron-transport layer | Bphen, 20 nm | Bphen, 20 nm |
| electron-injection layer | LiF, 1 nm | LiF, 1 nm |
| second electrode | Al, 200 nm | Al, 200 nm |

In a glove box containing a nitrogen atmosphere, these light-emitting elements were sealed so as not to be exposed to air. Then, operation characteristics of these light-emitting elements were measured. Note that the measurements were carried out at room temperature (in the atmosphere kept at 25° C.).

Figure 17:
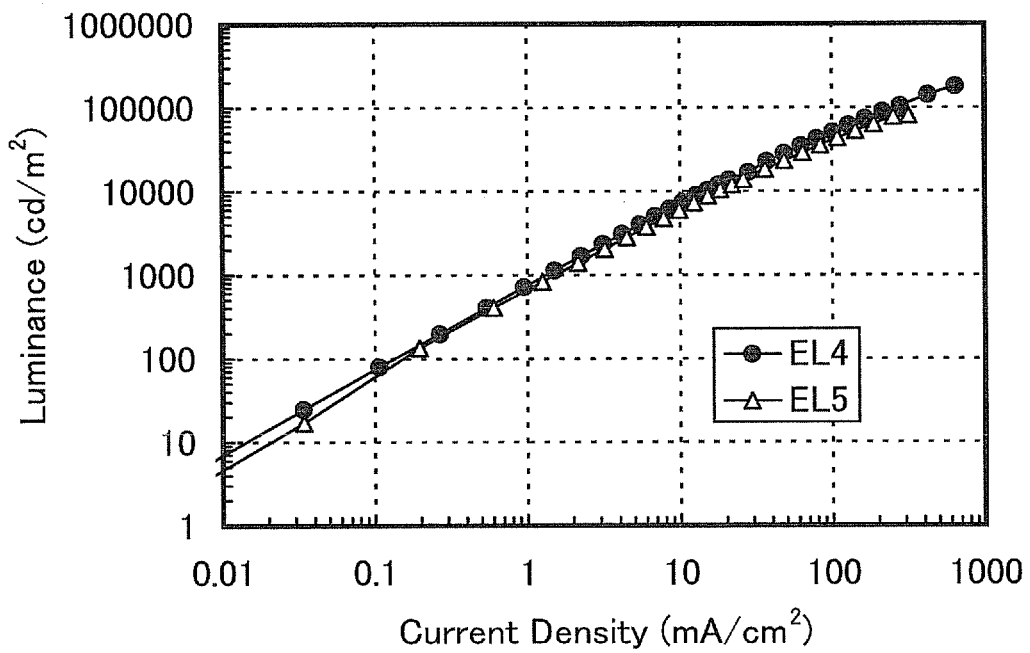
FIG. 17 shows current density-luminance characteristics of light-emitting elements of Example 3.
Figure 18:
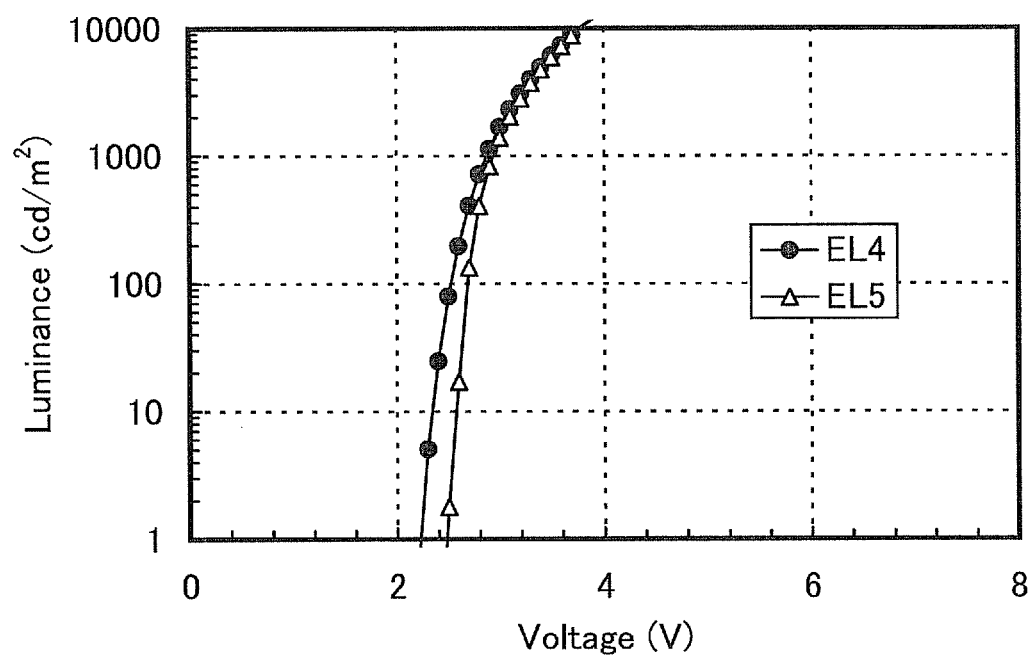
FIG. 18 shows voltage-luminance characteristics of the light-emitting elements of Example 3.
Figure 19:
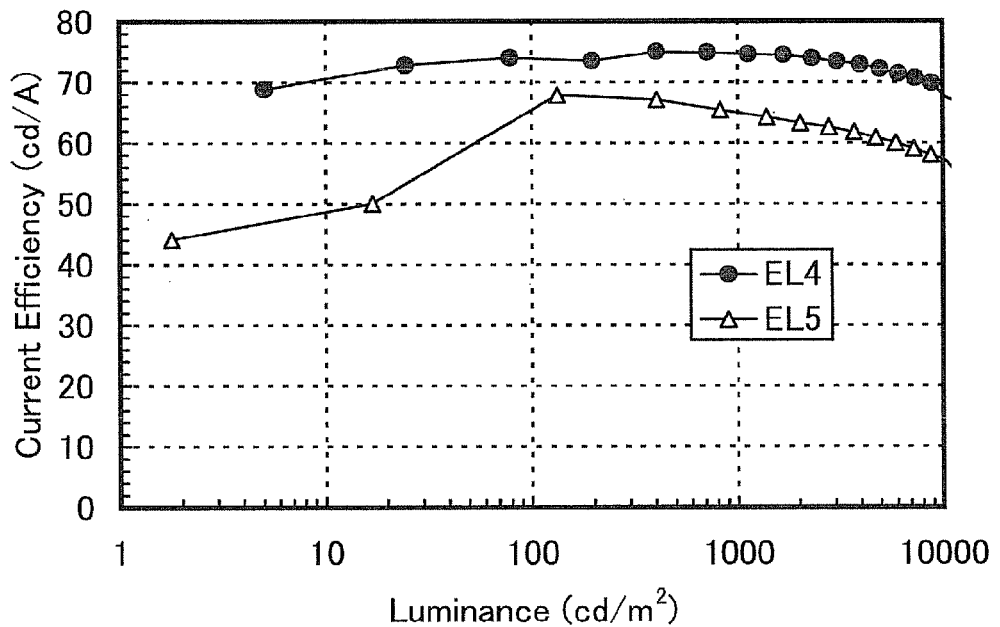
FIG. 19 shows luminance-current efficiency characteristics of the light-emitting elements of Example 3.
Figure 20:
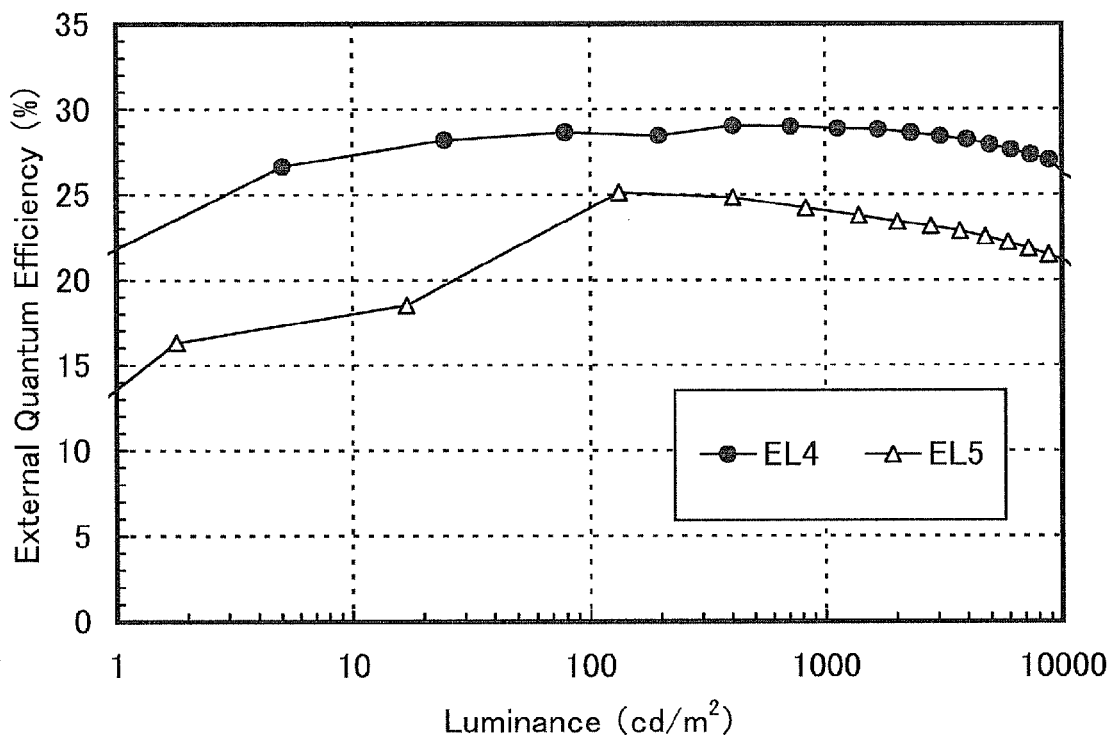
FIG. 20 shows luminance-external quantum efficiency characteristics of the light-emitting elements of Example 3.

FIG. 17 shows current density-luminance characteristics of the light-emitting element 4 (EL4) and the comparative light-emitting element 5 (EL5). In FIG. 17, the horizontal axis represents current density (mA/cm$^2$), and the vertical axis represents luminance (cd/m$^2$). FIG. 18 shows voltage-luminance characteristics thereof. In FIG. 18, the horizontal axis represents voltage (V), and the vertical axis represents luminance (cd/m$^2$). FIG. 19 shows luminance-current efficiency characteristics thereof. In FIG. 19, the horizontal axis represents luminance (cd/m$^2$), and the vertical axis represents current efficiency (cd/A). FIG. 20 shows luminance-external quantum efficiency characteristics thereof. In FIG. 20, the horizontal axis represents luminance (cd/m$^2$), and the vertical axis represents external quantum efficiency (%).

Further, Table 6 shows the voltage (V), current density (mA/cm$^2$), CIE chromaticity coordinates (x, y), current efficiency (cd/A), power efficiency (lm/W), and external quantum efficiency (%) of each of the light-emitting element 4 and the comparative light-emitting element 5 at a luminance of around 1000 cd/m$^2$.

TABLE 6

| | voltage (V) | current density (mA/cm$^2$) | chromaticity coordinates (x, y) | luminance (cd/m$^2$) | current efficiency (cd/A) | power efficiency (lm/W) | external quantum efficiency (%) |
|---|---|---|---|---|---|---|---|
| light-emitting element 4 | 2.9 | 1.5 | (0.57, 0.43) | 1100 | 75 | 81 | 29 |
| comparative light-emitting element 5 | 2.9 | 1.3 | (0.56, 0.44) | 830 | 65 | 71 | 24 |

Figure 21:
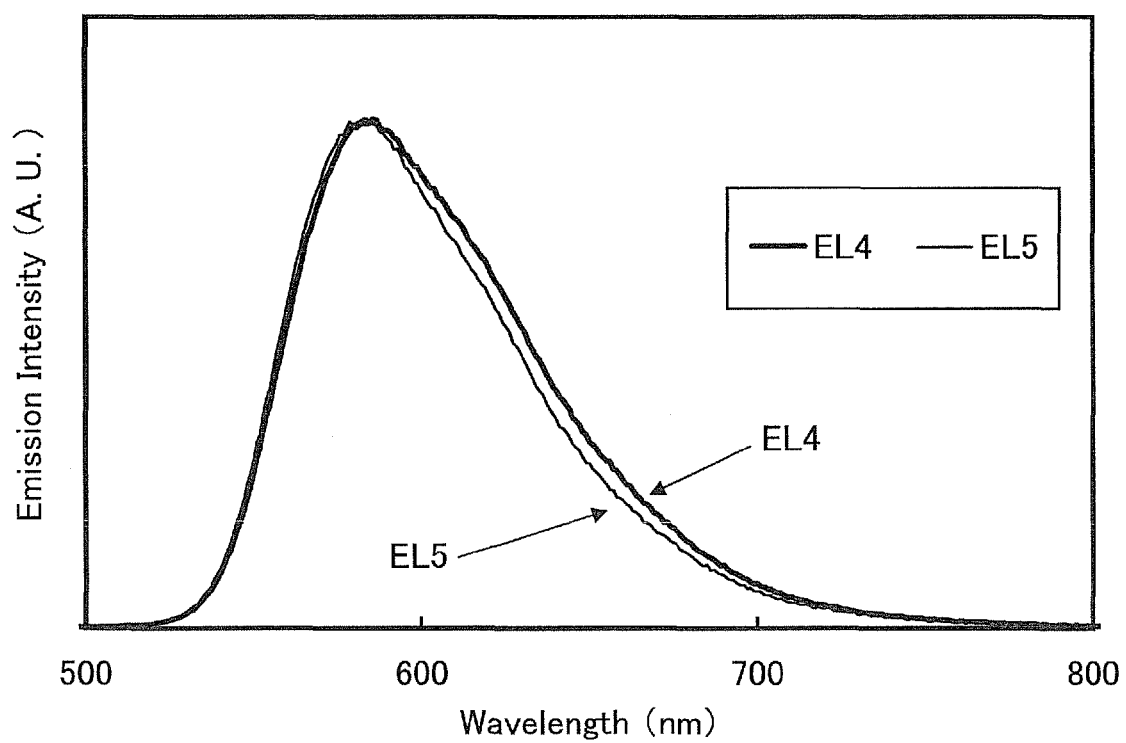
FIG. 21 shows an emission spectrum of the light-emitting elements of Example 3.

FIG. 21 shows emission spectra of the light-emitting element 4 (EL4) and the comparative light-emitting element 5 (EL5) which were obtained by applying a current of 0.1 mA. In FIG. 21, the horizontal axis represents wavelength (nm), and the vertical axis represents emission intensity (arbitrary unit). As shown in Table 6, the CIE chromaticity coordinates of the light-emitting element 4 at a luminance of 1100 cd/m$^2$ were (x, y)=(0.57, 0.43), and the CIE chromaticity coordinates of the comparative light-emitting element 5 at a luminance of 830 cd/m$^2$ were (x, y)=(0.56, 0.44). These results show that orange light emission originating from [Ir(dppm)$_2$(acac)] was obtained from the light-emitting element 4 and the comparative light-emitting element 5.

As can be seen from Table 6 and FIGS. 17 to 20, the light-emitting element 4 has higher current efficiency, higher power efficiency, and higher external quantum efficiency than the comparative light-emitting element 5. The above results show that an element having high external quantum efficiency can be obtained by application of one embodiment of the present invention.

EXAMPLE 4

In this example, a light-emitting element of one embodiment of the present invention will be described. A chemical formula of a material used in this example is shown below. Note that chemical formulae of the materials used in the above examples are omitted here.

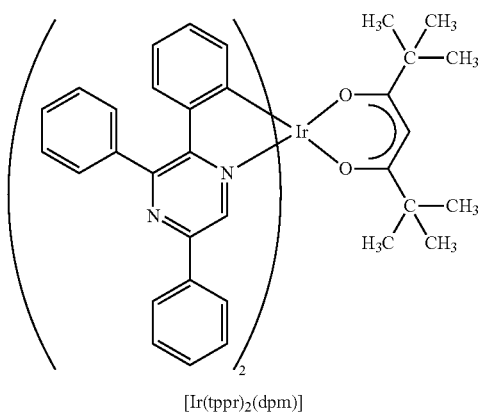

[Ir(tppr)₂(dpm)]

Methods for manufacturing a light-emitting element 6 and a comparative light-emitting element 7 of this example will be described below.
(Light-Emitting Element 6)

A light-emitting layer of the light-emitting element 6 was formed by co-evaporating 2mDBTPDBq-II, NPB, and [Ir(tppr)₂(dpm)]. Here, the weight ratio of 2mDBTPDBq-II to NPB and [Ir(tppr)₂(dpm)] was adjusted to 0.8:0.2:0.05 (=2mDBTPDBq-II:NPB:[Ir(tppr)₂(dpm)]). The thickness of the light-emitting layer was set to 40 nm. Components other than the light-emitting layer were manufactured in a manner similar to that of the light-emitting element 4 described in Example 3.
(Comparative Light-Emitting Element 7)

A light-emitting layer of the comparative light-emitting element 7 was formed by co-evaporating 2mDBTPDBq-II and [Ir(tppr)₂(dpm)]. Here, the weight ratio of 2mDBTP-DBq-II to [Ir(tppr)₂(dpm)] was adjusted to 1:0.05 (=2mDBT-PDBq-II:[Ir(tppr)₂(dpm)]). The thickness of the light-emitting layer was set to 40 nm. Components other than the light-emitting layer were manufactured in a manner similar to that of the light-emitting element 4 described in Example 3.

Table 7 shows element structures of the light-emitting element 6 and the comparative light-emitting element 7 obtained as described above.

TABLE 7

| | light-emitting element 6 | comparative light-emitting element 7 |
| --- | --- | --- |
| first electrode | ITSO, 110 nm | ITSO, 110 nm |
| hole-injection layer | DBT3P-II:MoOx (=4:2), 40 nm | DBT3P-II:MoOx (=4:2), 40 nm |
| hole-transport layer | BPAFLP, 20 nm | BPAFLP, 20 nm |

TABLE 7-continued

| | light-emitting element 6 | comparative light-emitting element 7 |
| --- | --- | --- |
| light-emitting layer | 2mDBTPDBq-II: NPB: [Ir(tppr)₂(dpm)] (=0.8:0.2:0.05), 40 nm | 2mDBTPDBq-II: [Ir(tppr)₂(dpm)] (=1:0.05), 40 nm |
| first electron-transport layer | 2mDBTPDBq-II, 10 nm | 2mDBTPDBq-II, 10 nm |
| second electron-transport layer | Bphen, 20 nm | Bphen, 20 nm |
| electron-injection layer | LiF, 1 nm | LiF, 1 nm |
| second electrode | Al, 200 nm | Al, 200 nm |

In a glove box containing a nitrogen atmosphere, these light-emitting elements were sealed so as not to be exposed to air. Then, operation characteristics of these light-emitting elements were measured. Note that the measurements were carried out at room temperature (in the atmosphere kept at 25° C.).

Figure 22:
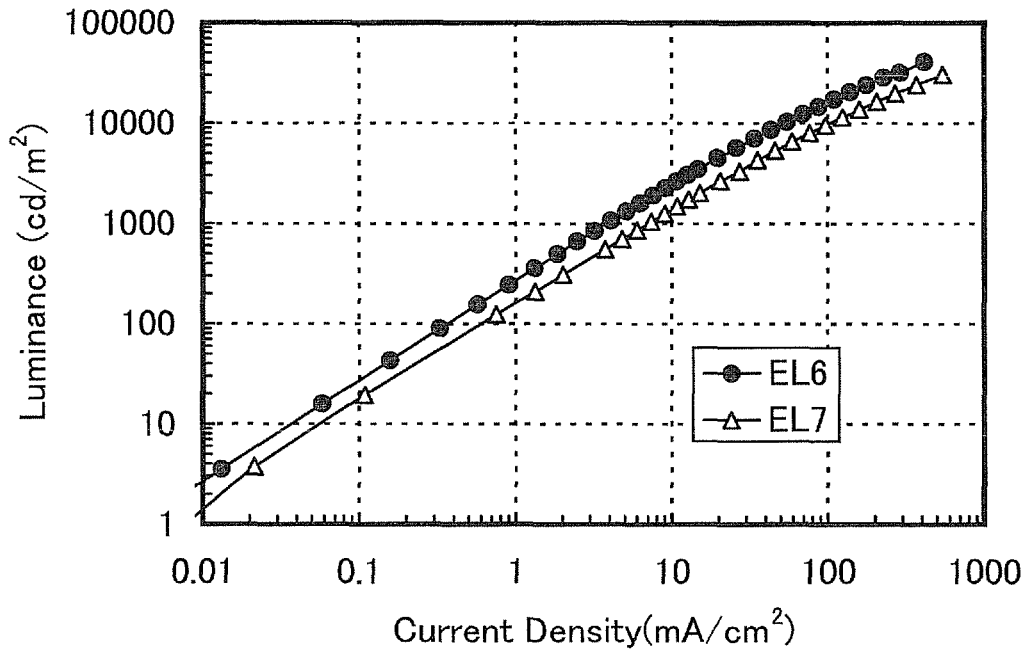
FIG. 22 shows current density-luminance characteristics of light-emitting elements of Example 4.
Figure 23:
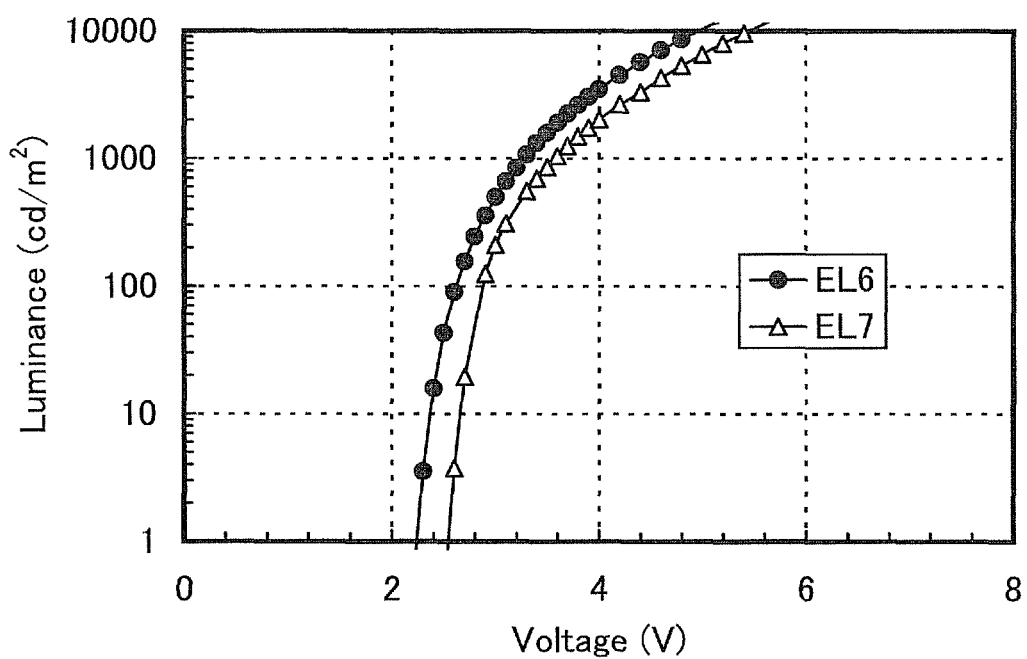
FIG. 23 shows voltage-luminance characteristics of the light-emitting elements of Example 4.
Figure 24:
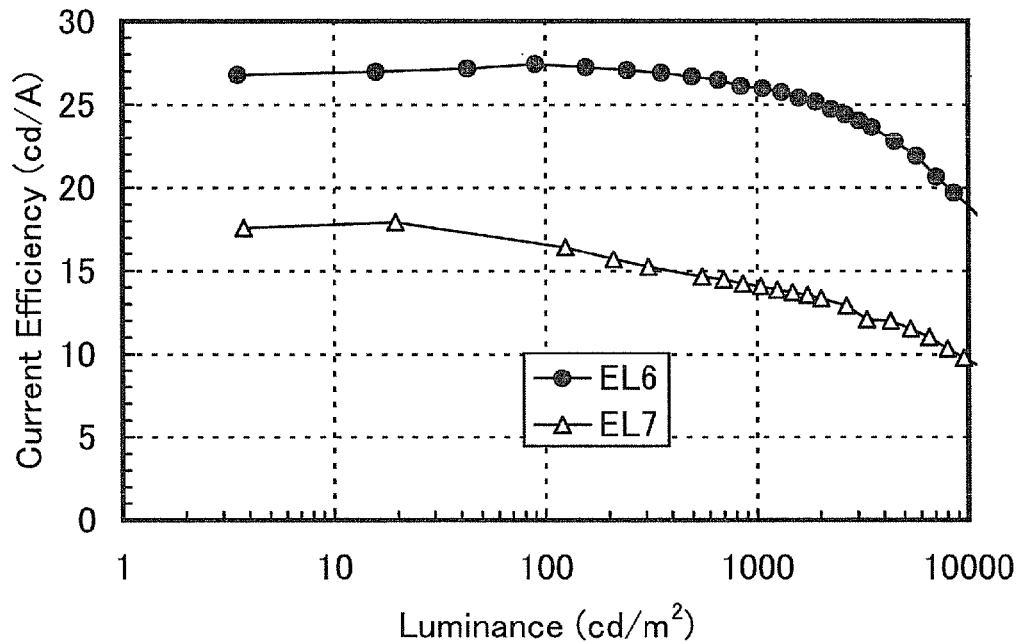
FIG. 24 shows luminance-current efficiency characteristics of the light-emitting elements of Example 4.
Figure 25:
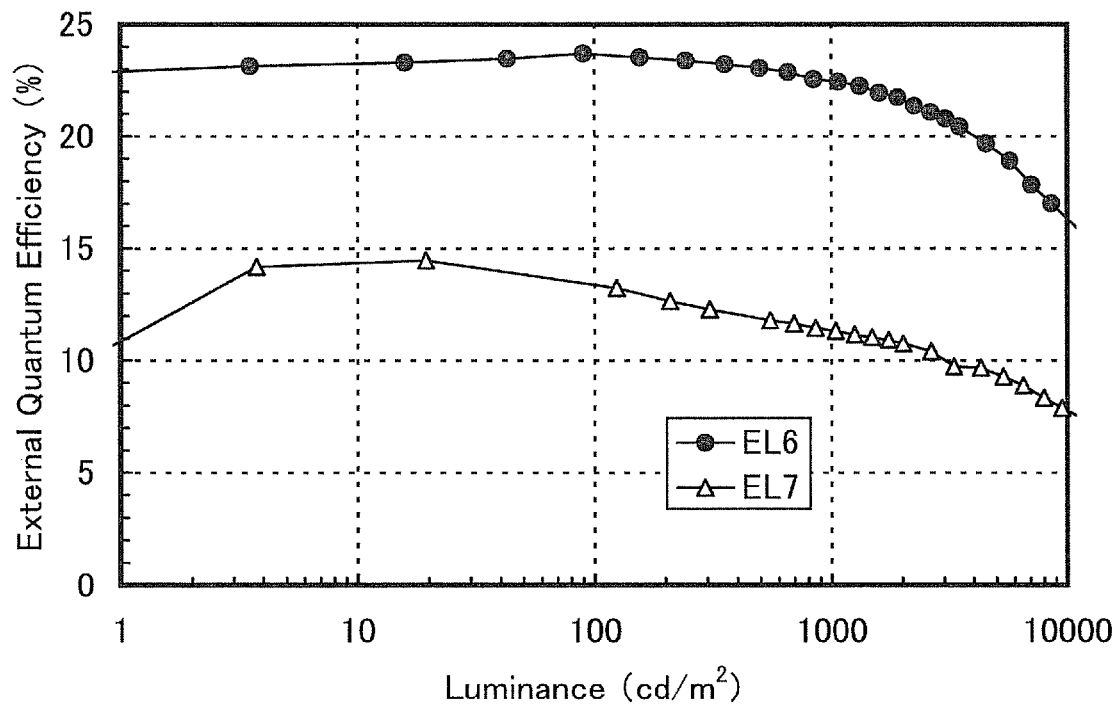
FIG. 25 shows luminance-external quantum efficiency characteristics of the light-emitting elements of Example 4.

FIG. 22 shows current density-luminance characteristics of the light-emitting element 6 (EL6) and the comparative light-emitting element 7 (EL7). In FIG. 22, the horizontal axis represents current density (mA/cm²), and the vertical axis represents luminance (cd/m²). FIG. 23 shows voltage-luminance characteristics thereof. In FIG. 23, the horizontal axis represents voltage (V), and the vertical axis represents luminance (cd/m²). FIG. 24 shows luminance-current efficiency characteristics thereof. In FIG. 24, the horizontal axis represents luminance (cd/m²), and the vertical axis represents current efficiency (cd/A). FIG. 25 shows luminance-external quantum efficiency characteristics thereof. In FIG. 25, the horizontal axis represents luminance (cd/m²), and the vertical axis represents external quantum efficiency (%).

Further, Table 8 shows the voltage (V), current density (mA/cm²), CIE chromaticity coordinates (x, y), current efficiency (cd/A), power efficiency (lm/W), and external quantum efficiency (%) of each of the light-emitting element 6 and the comparative light-emitting element 7 at a luminance of around 1000 cd/m².

TABLE 8

| | voltage (V) | current density (mA/cm²) | chromaticity coordinates (x, y) | luminance (cd/m²) | current efficiency (cd/A) | power efficiency (lm/W) | external quantum efficiency (%) |
| --- | --- | --- | --- | --- | --- | --- | --- |
| light-emitting element 6 | 3.3 | 4.1 | (0.66, 0.34) | 1100 | 26 | 25 | 22 |
| comparative light-emitting element 7 | 3.6 | 7.4 | (0.66, 0.34) | 1000 | 14 | 12 | 11 |

Figure 26:
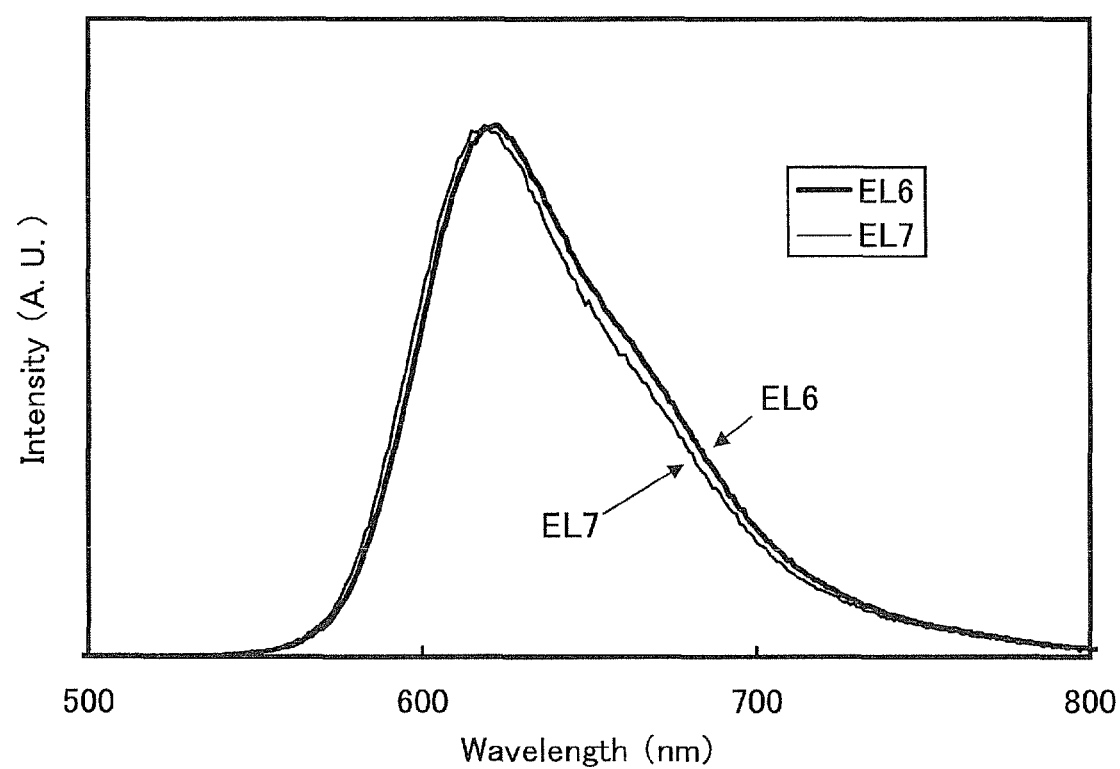
FIG. 26 shows an emission spectrum of the light-emitting elements of Example 4.

FIG. 26 shows emission spectra of the light-emitting element 6 (EL6) and the comparative light-emitting element 7 (EL7) which were obtained by applying a current of 0.1 mA. In FIG. 26, the horizontal axis represents wavelength (nm), and the vertical axis represents emission intensity (arbitrary unit). As shown in Table 8, the CIE chromaticity coordinates of the light-emitting element 6 at a luminance of 1100 cd/m² were (x, y)=(0.66, 0.34), and the CIE chromaticity coordinates of the comparative light-emitting element 7 at a luminance of 1000 cd/m² were (x, y)=(0.66, 0.34). These results show that red light emission originating from [Ir(tppr)₂

(dpm)] was obtained from the light-emitting element 6 and the comparative light-emitting element 7.

As can be seen from Table 8 and FIGS. 22 to 25, the light-emitting element 6 has higher current efficiency, higher power efficiency, and higher external quantum efficiency than the comparative light-emitting element 7. The above results show that an element having high external quantum efficiency can be obtained by application of one embodiment of the present invention.

Figure 27:
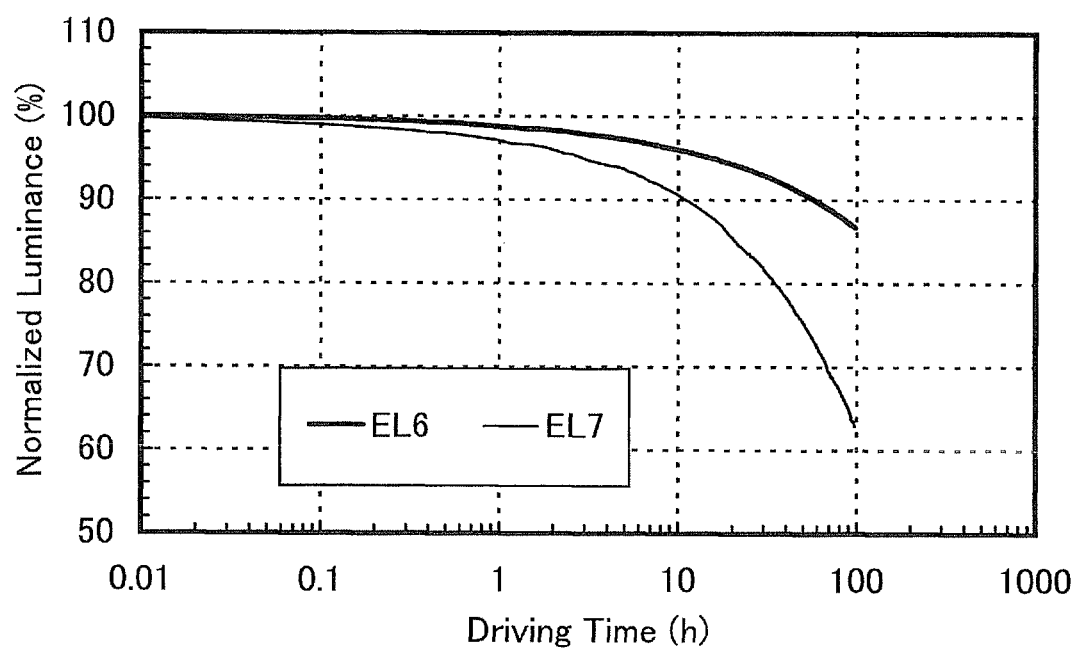
FIG. 27 shows results of reliability tests of the light-emitting element of Example 4.

Next, the light-emitting element 6 (EL6) and the comparative light-emitting element 7 (EL7) were subjected to reliability tests. Results of the reliability tests are shown in FIG. 27. In FIG. 27, the vertical axis represents normalized luminance (%) with an initial luminance of 100%, and the horizontal axis represents driving time (h) of the elements.

In the reliability tests, the light-emitting element 6 and the comparative light-emitting element 7 were driven under the conditions where the initial luminance was set to 5000 cd/m$^2$ and the current density was constant.

The luminance of the comparative light-emitting element 7 after 97 hours was 63% of the initial luminance. The luminance of the light-emitting element 6 after 98 hours was 87% of the initial luminance. From the results, the light-emitting element 6 is found to have a longer lifetime than the comparative light-emitting element 7.

The above results show that an element having high reliability can be obtained by application of one embodiment of the present invention.

EXAMPLE 5

In this example, a light-emitting element of one embodiment of the present invention will be described. A chemical formula of a material used in this example is shown below. Note that structural formulae of the materials used in the above examples are omitted here.

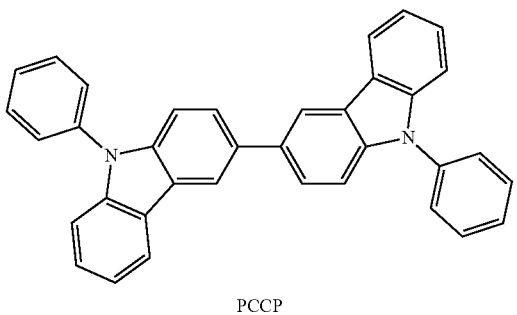

PCCP

Methods for manufacturing a light-emitting element 8 and a light-emitting element 9 of this example will be described below.

(Light-Emitting Element 8)

First, a film of ITSO was formed over a glass substrate by a sputtering method, so that a first electrode functioning as an anode was formed. Note that the thickness was set to 110 nm and the electrode area was set to 2 mm×2 mm.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately 10$^{-4}$ Pa, and was subjected to vacuum baking at 170° C. for 30 minutes in a heating chamber of the vacuum evaporation apparatus, and then the substrate was cooled down for about 30 minutes.

Next, the substrate provided with the first electrode was fixed to a substrate holder in the vacuum evaporation apparatus so that a surface on which the first electrode was provided faced downward. The pressure in the vacuum evaporation apparatus was reduced to about 10$^{-4}$ Pa. Then, BPAFLP and molybdenum(VI) oxide were co-evaporated to form a hole-injection layer over the first electrode. The thickness of the hole-injection layer was set to 40 nm, and the weight ratio of BPAFLP to molybdenum oxide was adjusted to 4:2 (=BPAFLP:molybdenum oxide).

Next, over the hole-injection layer, a film of BPAFLP was formed to a thickness of 20 nm to form a hole-transport layer.

Furthermore, 2mDBTPDBq-II, PCBNBB, and [Ir(mppr-Me)$_2$(dpm)] were co-evaporated to form a light-emitting layer over the hole-transport layer. Here, the weight ratio of 2mDBTPDBq-II to PCBNBB and [Ir(mppr-Me)$_2$(dpm)] was adjusted to 0.8:0.2:0.05 (=2mDBTPDBq-II:PCBNBB:[Ir(mppr-Me)$_2$(dpm)]). The thickness of the light-emitting layer was set to 20 nm.

Further, over the light-emitting layer, 2mDBTPDBq-II, PCBNBB, and [Ir(mppr-Me)$_2$(dpm)] were co-evaporated to form a first electron-transport layer over the light-emitting layer. Here, the weight ratio of 2mDBTPDBq-III to PCBNBB and [Ir(mppr-Me)$_2$(dpm)] was adjusted to 0.8:0,2:0.05 (=2mDBTPDBq-II:PCBNBB:[Ir(mppr-Me)$_2$(dpm)]). The thickness of the first electron-transport layer was set to 40 nm.

Next, over the first electron-transport layer, a film of BPhen was formed to a thickness of 10 nm to form a second electron-transport layer.

Further, over the second electron-transport layer, a film of LiF was formed by evaporation to a thickness of 1 nm to form an electron-injection layer.

Lastly, an aluminum film was formed by evaporation to a thickness of 200 nm as a second electrode functioning as a cathode. Thus, the light-emitting element 8 of this example was fabricated.

(Light-Emitting Element 9)

A light-emitting layer of the light-emitting element 9 was formed by co-evaporating 2mDBTPDBq-II, PCCP, and [Ir(mppr-Me)$_2$(dpm)]. Here, the weight ratio of 2mDBTPDBq-II to PCCP and [Ir(mppr-Me)$_2$(dpm)] was adjusted to 0.8:0.2:0.05 (=2mDBTPDBq-II:PCCP:[Ir(mppr-Me)$_2$(dpm)]). The thickness of the light-emitting layer was set to 20 nm. Components other than the light-emitting layer were manufactured in a manner similar to that of the light-emitting element 8.

Note that, in all the above evaporation steps, evaporation was performed by a resistance-heating method.

Table 9 shows element structures of the light-emitting element 8 and the light-emitting element 9 obtained as described above. Note that the compositions of the first electrode, the hole-injection layer, the hole-transport layer, the electron-injection layer, and the second electrode are omitted here because they are the same as those in Example 1. Table 1 may be referred to.

TABLE 9

|  | light-emitting element 8 | light-emitting element 9 |
|---|---|---|
| light-emitting layer | 2mDBTPDBq-II: PCBNBB: [Ir(mppr-Me)$_2$(dpm)] (=0.8:0.2:0.05), 20 nm | 2mDBTPDBq-II: PCCP: [Ir(mppr-Me)$_2$(dpm)] (=0.8:0.2:0.05), 20 nm |

TABLE 9-continued

|  | light-emitting element 8 | light-emitting element 9 |
|---|---|---|
| first electron-transport layer | 2mDBTPDBq-II: PCBNBB: [Ir(mppr-Me)$_2$(dpm)] (=0.8:0.2:0.05), 40 nm | 2mDBTPDBq-II: PCBNBB: [Ir(mppr-Me)$_2$(dpm)] (=0.8:0.2:0.05), 40 nm |
| second electron-transport layer | Bphen, 10 nm | Bphen, 10 nm |

In a glove box containing a nitrogen atmosphere, these light-emitting elements were sealed so as not to be exposed to air. Then, operation characteristics of these light-emitting elements were measured. Note that the measurements were carried out at room temperature (in the atmosphere kept at 25° C.).

Figure 28:
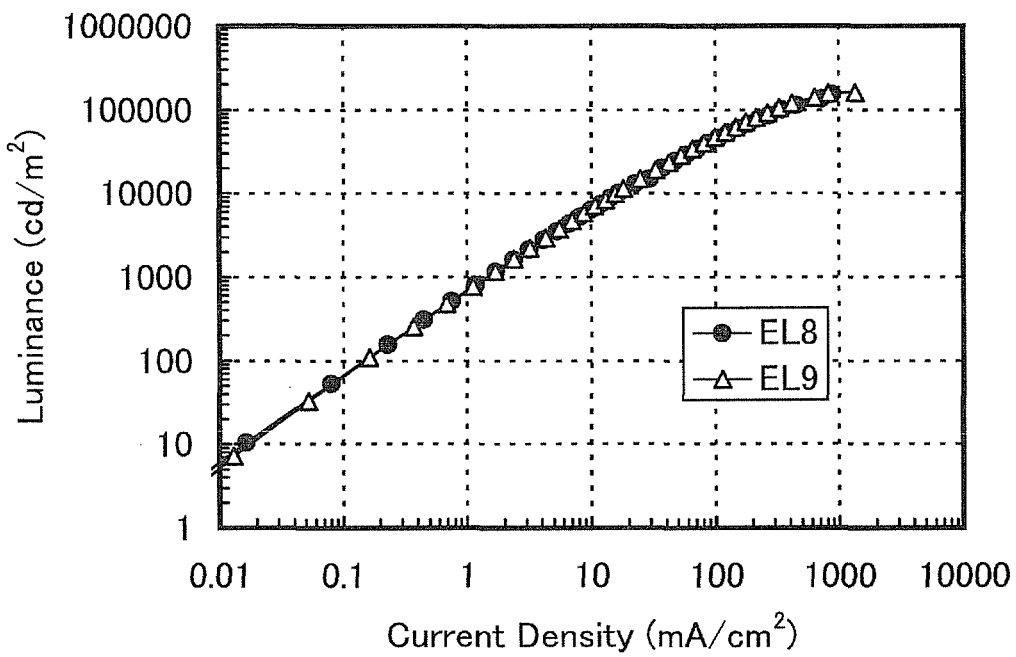
FIG. 28 shows current density-luminance characteristics of light-emitting elements of Example 5.
Figure 29:
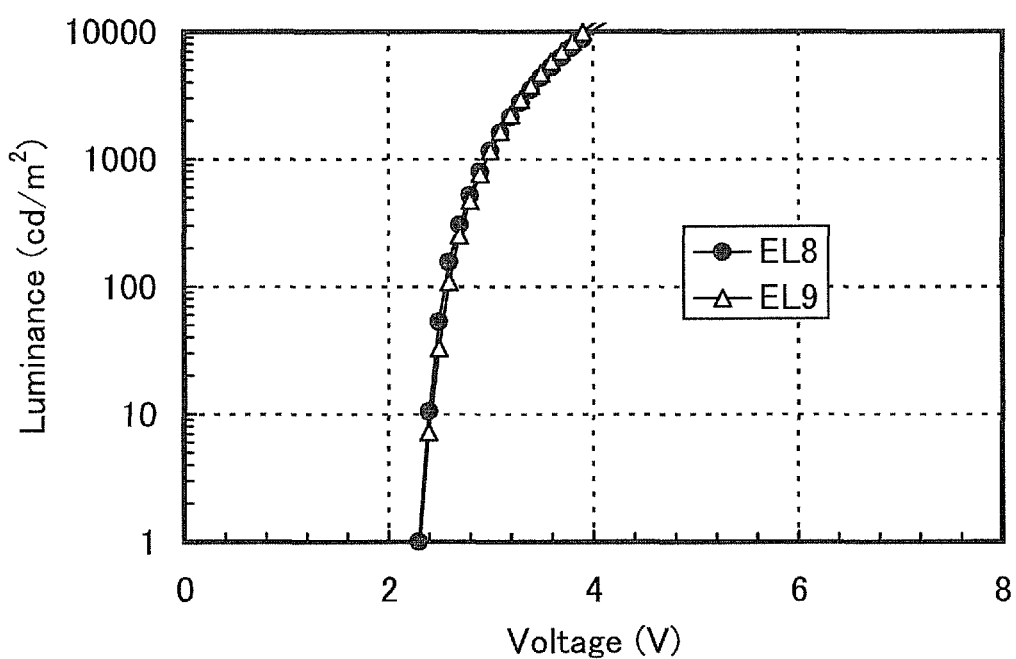
FIG. 29 shows voltage-luminance characteristics of the light-emitting elements of Example 5.
Figure 30:
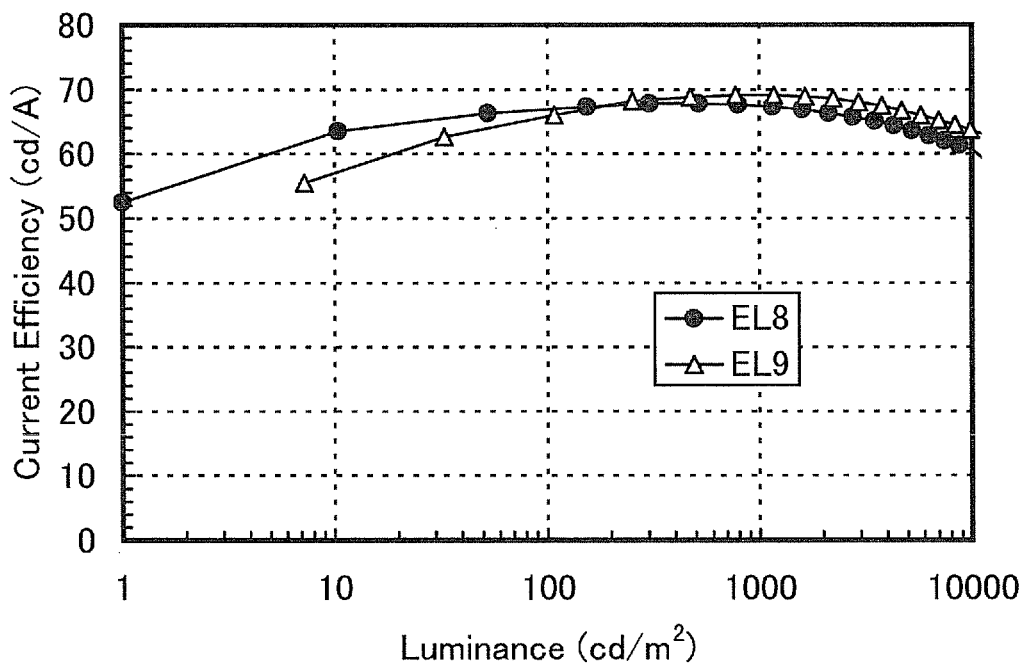
FIG. 30 shows luminance-current efficiency characteristics of the light-emitting elements of Example 5.
Figure 31:
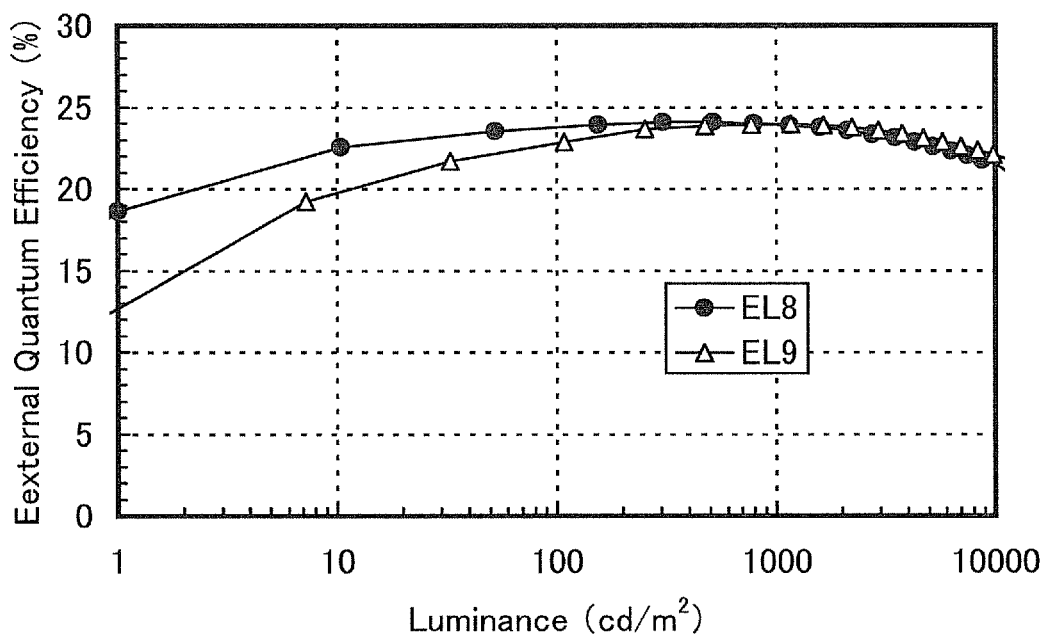
FIG. 31 shows luminance-external quantum efficiency characteristics of the light-emitting elements of Example 5.

FIG. 28 shows current density-luminance characteristics of the light-emitting element 8 (EL8) and the light-emitting element 9 (EL9). In FIG. 28, the horizontal axis represents current density (mA/cm$^2$), and the vertical axis represents luminance (cd/m$^2$). FIG. 29 shows voltage-luminance characteristics thereof. In FIG. 29, the horizontal axis represents voltage (V), and the vertical axis represents luminance (cd/m$^2$). FIG. 30 shows luminance-current efficiency characteristics thereof. In FIG. 30, the horizontal axis represents luminance (cd/m$^2$), and the vertical axis represents current efficiency (cd/A). FIG. 31 shows luminance-external quantum efficiency, characteristics thereof. In FIG. 31, the horizontal axis represents luminance (cd/m$^2$), and the vertical axis represents external quantum efficiency (%).

Further, Table 10 shows the voltage (V), current density (mA/cm$^2$), CIE chromaticity coordinates (x, y), current efficiency (cd/A), power efficiency (lm/W), and external quantum efficiency (%) of each of the light-emitting element 8 and the light-emitting element 9 at a luminance of 1200 cd/m$^2$.

TABLE 10

|  | voltage (V) | current density (mA/cm$^2$) | chromaticity coordinates (x, y) | luminance (cd/m$^2$) | current efficiency (cd/A) | power efficiency (lm/W) | external quantum efficiency (%) |
|---|---|---|---|---|---|---|---|
| light-emitting element 8 | 3.0 | 1.7 | (0.54, 0.45) | 1200 | 67 | 70 | 24 |
| light-emitting element 9 | 3.0 | 1.7 | (0.54, 0.46) | 1200 | 69 | 72 | 24 |

Figure 32:
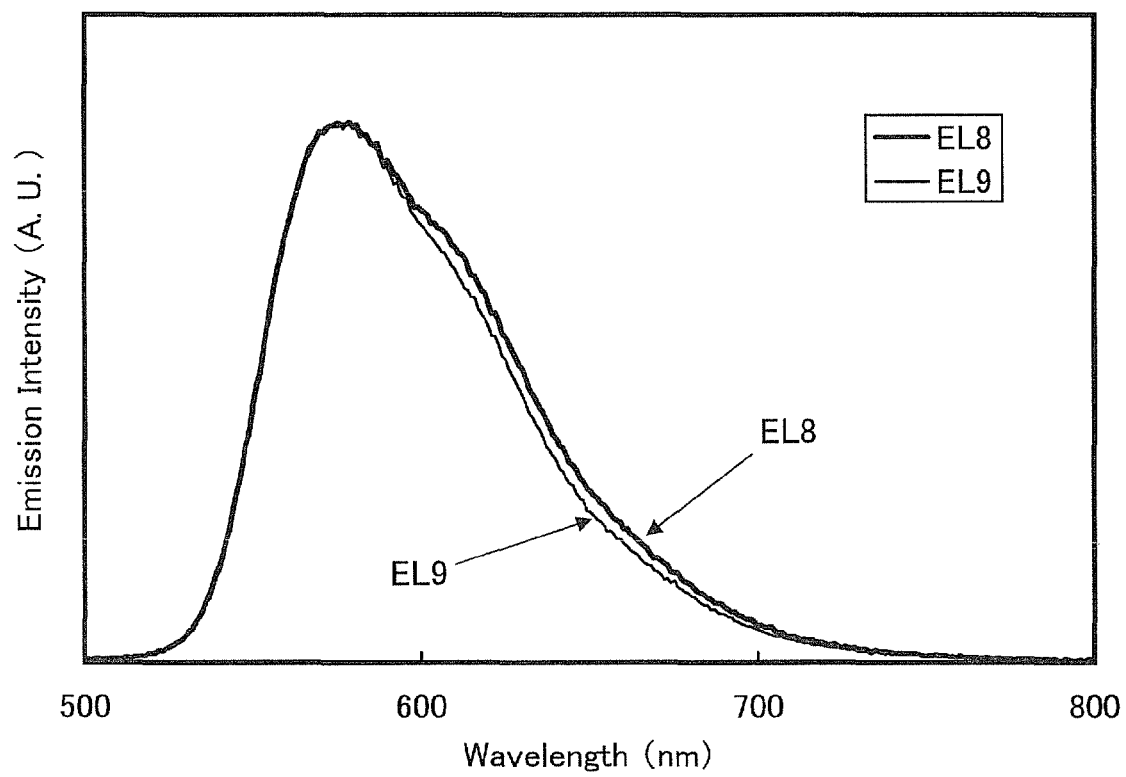
FIG. 32 shows an emission spectrum of the light-emitting elements of Example 5.

FIG. 32 shows emission spectra of the light-emitting element 8 and the light-emitting element 9 which were obtained by applying a current of 0.1 mA. In FIG. 32, the horizontal axis represents wavelength (nm), and the vertical axis represents emission intensity (arbitrary unit). As shown in Table 10, the CIE chromaticity coordinates of the light-emitting element 8 at a luminance of 1200 cd/m$^2$ were (x, y)=(0.54, 0.45), and the CIE chromaticity coordinates of the light-emitting element 9 at a luminance of 1200 cd/m$^2$ were (x, y)=(0.54, 0.46). These results show that orange light emission originating from [Ir(mppr-Me)$_2$(dpm)] was obtained from the light-emitting element 8 and the light-emitting element 9.

As can be seen from Table 10 and FIGS. 28 to 31, the light-emitting element 8 and the light-emitting element 9 have substantially equal current efficiency, power efficiency, and external quantum efficiency. A difference between the light-emitting element 8 and the light-emitting element 9 is the p-type host used in the light-emitting layer; PCBNBB which is an aromatic amine is used for the light-emitting element 8, whereas PCCP which is a non-amine is used for the light-emitting element 9. However, there is substantially no difference in characteristics, which indicates that favorable characteristics can be obtained even with the use of a non-amine as a p-type host.

Explanation of Reference

P-HC: p-type host cluster, N-HC: n-type host cluster, G: guest molecule, and EML: light-emitting layer.

This application is based on Japanese Patent Application serial no. 2011-031013 filed with Japan Patent Office on Feb. 16, 2011, the entire contents of which are hereby incorporated by reference.

The invention claimed is:

1. An organic light-emitting device comprising:
   a light-emitting layer comprising:
      guest molecules including a first guest molecule that is an iridium complex;
      n-type host molecules including a first n-type host molecule including a heteroaromatic ring; and
      p-type host molecules including a first p-type host molecule including an aromatic amine,
   wherein the p-type host molecules and the n-type host molecules are mixed in the light-emitting layer,
   wherein the first n-type host molecule is adjacent to an end of a ligand of the first quest molecule,
   wherein the first p-type host molecule is adjacent to an iridium-benzene skeleton of the first guest molecule,
   wherein the first guest molecule is sandwiched between the first n-type host molecule that is next to the first guest molecule and the first p-type host molecule that is next to the first guest molecule, and
   wherein molecular orbitals of the first guest molecule, the first n-type host molecule and the first p-type host molecule are overlapped with each other so that the first guest molecule, the first n-type host molecule and the first p-type host molecule interact with each other.

2. The organic light-emitting device according to claim 1, comprising two or more light-emitting layers.

3. The organic light-emitting device according to claim 1, wherein at least two light-emitting layers emit light with different wavelengths.

4. An organic light-emitting device comprising:
   a light-emitting layer comprising:
      a plurality of guest clusters, wherein each of the guest clusters includes at least one molecule of a guest material that is an iridium complex;
      a plurality of n-type host clusters, wherein each of the n-type host clusters includes at least one molecule of an n-type material including a heteroaromatic ring; and a plurality of p-type host clusters, wherein each of the p-type host clusters includes at least one molecule of a p-type material including an aromatic amine, wherein each of the n-type host clusters that is next to one of the guest clusters and each of the p-type host clusters that is next to the one of the guest clusters are arranged with the one of the guest clusters sandwiched therebetween, wherein the n-type host clusters and the p-type host clusters are dispersed in the light-emitting layer, wherein the at least one molecule of an n-type material is adjacent to an end of a ligand of the at least one molecule of a guest material, wherein the at least one molecule of a p-type material is adjacent to an iridium-benzene skeleton of the at least one molecule of a guest material, and wherein molecular orbitals of the one of the guest clusters, one of the n-type host clusters and one of the p-type host clusters are overlapped with each other so that the one of the guest clusters, the one of the n-type host clusters and the one of the p-type host clusters interact with each other.

5. The organic light-emitting device according to claim 4, comprising two or more light-emitting layers.

6. The organic light-emitting device according to claim 4, wherein at least two light-emitting layers emit light with different wavelengths.

7. An organic light-emitting device comprising:
a light-emitting layer comprising:
   guest molecules including a first guest molecule that is an iridium complex;
   n-type host molecules including a first n-type host molecule including a heteroaromatic ring; and
   p-type host molecules including a first p-type host molecule including an aromatic amine,
wherein the p-type host molecules and the n-type host molecules are mixed in the light-emitting layer,
wherein the first n-type host molecule is adjacent to an end of a ligand of the first guest molecule,
wherein the first p-type host molecule is adjacent to an iridium-benzene skeleton of the first guest molecule, and
wherein molecular orbitals of the first guest molecule, the first n-type host molecule and the first p-type host molecule are overlapped with each other so that the first guest molecule, the first n-type host molecule and the first p-type host molecule interact with each other.

8. The organic light-emitting device according to claim 7, comprising two or more light-emitting layers.

9. The organic light-emitting device according to claim 7, wherein at least two light-emitting layers emit light with different wavelengths.

10. The organic light-emitting device according to claim 1, wherein the guest molecules include a second guest molecule and a third guest molecule;
wherein the n-type host molecules include a second n-type host molecule;
wherein the p-type host molecules include a second p-type host molecule,
wherein the second guest molecule is sandwiched between the first n-type host molecule and the second p-type host molecule, and
wherein the third guest molecule is sandwiched between the first p-type host molecule and the second n-type host molecule.

11. The organic light-emitting device according to claim 4, wherein two of the guest clusters are arranged with one of the n-type host clusters and the p-type host clusters sandwiched therebetween.

12. The organic light-emitting device according to claim 7, wherein the guest molecules include a second guest molecule and a third guest molecule;
wherein the n-type host molecules include a second n-type host molecule;
wherein the p-type host molecules include a second p-type host molecule,
wherein the second guest molecule is sandwiched between the first n-type host molecule and the second p-type host molecule, and
wherein the third guest molecule is sandwiched between the first p-type host molecule and the second n-type host molecule.

13. The organic light-emitting device according to claim 1, wherein a nearest molecule to the first guest molecule is one of the first n-type host molecule and the first p-type host molecule, and
wherein a second nearest molecule to the first guest molecule is the other of the first n-type host molecule and the first p-type host molecule.

14. The organic light-emitting device according to claim 4, wherein at least 10 of the n-type host clusters and the p-type host clusters alternately exist in a direction of carrier movement in the light-emitting layer.

15. The organic light-emitting device according to claim 7, wherein a nearest molecule to the first guest molecule is one of the first n-type host molecule and the first p-type host molecule, and
wherein a second nearest molecule to the first guest molecule is the other of the first n-type host molecule and the first p-type host molecule.

* * * * *